United States Patent
Park

(10) Patent No.: US 11,004,485 B2
(45) Date of Patent: May 11, 2021

(54) APPARATUS AND METHOD FOR IMPROVING INPUT/OUTPUT THROUGHPUT OF MEMORY SYSTEM

(71) Applicant: SK hynix Inc., Icheon (KR)

(72) Inventor: Jeen Park, Seongnam (KR)

(73) Assignee: SK hynix Inc., Icheon (KR)

(*) Notice: Subject to any disclaimer, the term of this patent is extended or adjusted under 35 U.S.C. 154(b) by 0 days.

(21) Appl. No.: 16/827,225

(22) Filed: Mar. 23, 2020

(65) Prior Publication Data
US 2021/0020208 A1    Jan. 21, 2021

(30) Foreign Application Priority Data
Jul. 15, 2019  (KR) .......................... 10-2019-0084914

(51) Int. Cl.
| G11C 7/10 | (2006.01) |
| G11C 7/22 | (2006.01) |
| G11C 29/44 | (2006.01) |

(52) U.S. Cl.
CPC .......... *G11C 7/1042* (2013.01); *G11C 7/1051* (2013.01); *G11C 7/1078* (2013.01); *G11C 7/22* (2013.01); *G11C 29/44* (2013.01)

(58) Field of Classification Search
CPC ... G11C 7/1042; G11C 7/1051; G11C 7/1078; G11C 7/22; G11C 29/44
See application file for complete search history.

(56) References Cited

U.S. PATENT DOCUMENTS

| 9,229,854 | B1 | 1/2016 | Kuzmin et al. |
| 9,432,298 | B1 | 8/2016 | Smith |
| 9,704,588 | B1* | 7/2017 | Ray .................... G11C 11/5628 |
| 10,353,829 | B2* | 7/2019 | Butcher ............. G06F 12/0846 |
| 2009/0135656 | A1* | 5/2009 | Park ................. G11C 29/50004 365/185.19 |
| 2017/0026441 | A1 | 1/2017 | Moudy et al. |
| 2020/0409875 | A1* | 12/2020 | Park .................... G06F 13/1647 |

* cited by examiner

*Primary Examiner* — Gene N Auduong

(57) ABSTRACT

A memory system includes: a plurality of memory dies, and a controller selects a second read request, including at least a portion of a plurality of first read requests, so that the memory dies interleave and output data corresponding to the first read requests, and performs a correlation operation for the selected second read request, when the second read request is selected, the controller determines whether the correlation operation is performed or not before a time at which the second read request is selected, determines whether the correlation operation is successful or not, determines a pending credit in response to an operation state of the memory dies at the time at which the second read request is selected, and determines whether to perform the correlation operation or not for the second read request that is selected at the time at which the second read request is selected based on the pending credit.

20 Claims, 11 Drawing Sheets

APPARATUS AND METHOD FOR IMPROVING INPUT/OUTPUT THROUGHPUT OF MEMORY SYSTEM

CROSS-REFERENCE TO RELATED APPLICATIONS

The present application claims priority of Korean Patent Application No. 10-2019-0084914, filed on Jul. 15, 2019, which is incorporated herein by reference in its entirety.

BACKGROUND

1. Field

Various embodiments of the invention relate to a memory system, and more particularly, to a method and an apparatus for improving data input/output performance through an interleaving operation on memory dies in the memory system.

2. Description of the Related Art

Recently, a computer environment paradigm has shifted to ubiquitous computing, which enables a computer system to be accessed anytime and everywhere. As a result, the use of portable electronic devices such as mobile phones, digital cameras, notebook computers and the like increases. Such portable electronic devices typically use or include a memory system that uses or embeds at least one memory device, i.e., a data storage device. The data storage device can be used as a main storage device or an auxiliary storage device of a portable electronic device.

In a computing device, unlike a hard disk, a data storage device used as a nonvolatile semiconductor memory device is advantageous in that it has excellent stability and durability because it has no mechanical driving part (e.g., a mechanical arm), and has high data access speed and low power consumption. Examples of such a data storage device include a universal serial bus (USB) memory device, a memory card having various interfaces, and a solid state drive (SSD).

SUMMARY

An embodiment of the disclosure may provide a memory system, a data processing system, and an operation process or a method, which may quickly and reliably process data into a memory device by reducing operational complexity and performance degradation of the memory system, thereby enhancing efficiency of the memory device.

In addition, an embodiment of the disclosure may provide a method and an apparatus for inputting and outputting plural pieces of data to and from a plurality of memory dies in a memory system in an interleaving format to improve data input/output performance (e.g., I/O throughput) of the memory system.

Further, an embodiment of the disclosure may provide a memory system which limitation not limited to a physical location in which a piece of data is to be stored for an interleaving operation, in a process of storing the piece of data in a plurality of memory dies, thereby effectively utilizing the plurality of memory dies in the memory system so that an operation stability and a lifespan of a memory system may be improved.

In addition, an embodiment of the disclosure may provide an apparatus and a method for dynamically determining whether to proceed or stop a correlation operation to plural requests based on a configuration of a memory system and/or characteristics of the correlation operation, which influences an operation such as reading or writing data performed in the memory system, so that overhead in operations performed in the memory system may be reduced.

In addition, an embodiment of the disclosure may provide a memory system including an address allocation scheme which reduces resources used for the correlation operation and supports an interleaving operation to a plurality of memory dies in the memory system, thereby increasing an operational efficiency of the memory system.

In accordance with an embodiment of the present invention, a memory system may include: a plurality of memory dies; and a controller that is coupled to the memory dies through a plurality of channels, the controller comprising circuitry that: selects a second read request, including at least a portion of a plurality of first read requests transferred from an external device, so that the memory dies interleave and output data corresponding to the first read requests through the channels, and performs a correlation operation for the selected second read request. When the second read request is selected, the controller may determine whether the correlation operation is performed or not before a time at which the second read request is selected, may determine whether the correlation operation is successful or not, may determine a pending credit in response to an operation state of the memory dies at the time at which the second read request is selected, and may determine whether to perform the correlation operation or not for the second read request that is selected at the time at which the second read request is selected based on the pending credit.

When the pending credit is less than a reference value, the controller may process the selected second read request without performing the correlation operation, and when the pending credit is equal to or greater than the reference value, the controller may perform the correlation operation for the selected second read request.

The controller may decrease the pending credit when at least one of the memory dies is in an idle state at the time at which the second read request is selected.

The amount by which the pending credit is decreased may be based on the number of memory dies that are in an idle state when the second read request is selected.

The controller may increase the pending credit when the second read request is processed without performing the correlation operation before the time at which the second read request is selected.

The amount by which the pending credit is decreased may be based on an expected processing time of the second read request that is processed without performing the correlation operation before the time at which the second read request is selected.

The controller may increase the pending credit in response to the correlation operation being successful before the time at which the second read request is selected and decreases the pending credit in response to a failure of the correlation operation before the time at which the second read request is selected.

The controller may adjust an amount by which the pending credit is increased based on how much time expected to be saved due to the success of the correlation operation that is performed before the time at which second read request is selected.

The controller may adjust a amount by which the pending credit is decreased based on an amount of time consumed due to the failure of the correlation operation that is performed before the time at which the second read request is selected.

When the second read request is not selected for more than a reference time after determining whether to perform the correlation operation or not based on the pending credit, and the controller may reset the pending credit to an initial value that is smaller than the reference value.

The controller may include: an input buffer configured to temporarily store the first read request; an output buffer configured to temporarily store data to be outputted to the external device; buffer control circuitry configured to monitor states of the input buffer and the output buffer and select the second read request; monitoring circuitry configured to monitor operation states of the memory dies; correlation circuitry configured to determine whether to perform the correlation operation for the second read request based on the pending credit, and output correlated read requests prior to uncorrelated read requests; pending credit determining circuitry configured to determine the pending credit in response to operations of the buffer control circuitry, the monitoring circuitry, and the correlation circuitry; and operation performing circuitry configured to perform address translation for a read request transferred from the correlation circuitry and transfer a resultant address to the memory dies through the channels.

In accordance with another embodiment of the present invention, a method for operating a memory system including a plurality of memory dies for storing data, may include: receiving a plurality of first read requests transferred from an external device; selecting a second read request including at least a portion of a plurality of first read requests to cause the memory dies to interleave and output data corresponding to the first read requests through the channels; when the second read request is selected, determining a pending credit in response to whether a correlation operation is performed or not before a the second read request is selected, determining whether the correlation operation is successful or not, and determining operation states of the memory dies when the second read request is selected; and determining whether to perform the correlation operation or not for the second read request based on the pending credit.

Determining whether to perform the correlation operation may include: when the pending credit is less than a reference value, processing the second read request without performing the correlation operation; and when the pending is equal to or greater than the reference value, performing the correlation operation for the second read request.

Determining the pending credit may include: decreasing the pending credit in response to at least one of the memory dies being in an idle state when the second read request is selected; increasing the pending credit when the second read request is processed without performing the correlation operation before the second read request is selected; increasing a value of the pending credit in response to the correlation operation being successful before the second read request is selected; and decreasing the value of the pending credit in response to a failure of the correlation operation before the second read request is selected.

The method may further include: adjusting an amount by which the pending credit is decreased based on a number of memory dies that are in an idle state when the second read request is selected.

The method may further include: adjusting an amount by which the pending credit is increased based on an expected processing time of the second read request that is processed without performing the correlation operation before the second read request is selected.

The method may further include: adjusting an amount by which the pending credit is increased based on a time expected to be shortened due to a successful correlation operation performed before the second read request is selected.

The method may further include: adjusting an amount by which the pending credit is decreased based on a time consumed due to a failed correlation operation that is performed before the second read request is selected.

The method may further include: resetting the pending credit to an initial value, wherein the initial value is smaller than the reference value, when the second read request is not selected for more than a reference time.

The method may further include: when the correlation operation for the second read request that is selected in selecting the second read request is performed in determining whether to perform the correlation operation for the second read request, translating an address for read requests that are correlated due to a successful correlation operation and transferring a resultant address to the memory dies through the channels; receiving data for the correlated read requests in an interleaving scheme through the channels after translating the address for the correlated read requests; translating an address for uncorrelated read requests that are not correlated due to a failed correlation operation and transferring a resultant address to the memory dies; receiving data corresponding to the uncorrelated read requests from the memory dies after translating the address translation for the uncorrelated read requests; and outputting the received data to the external device.

DETAILED DESCRIPTION

Figure 1:
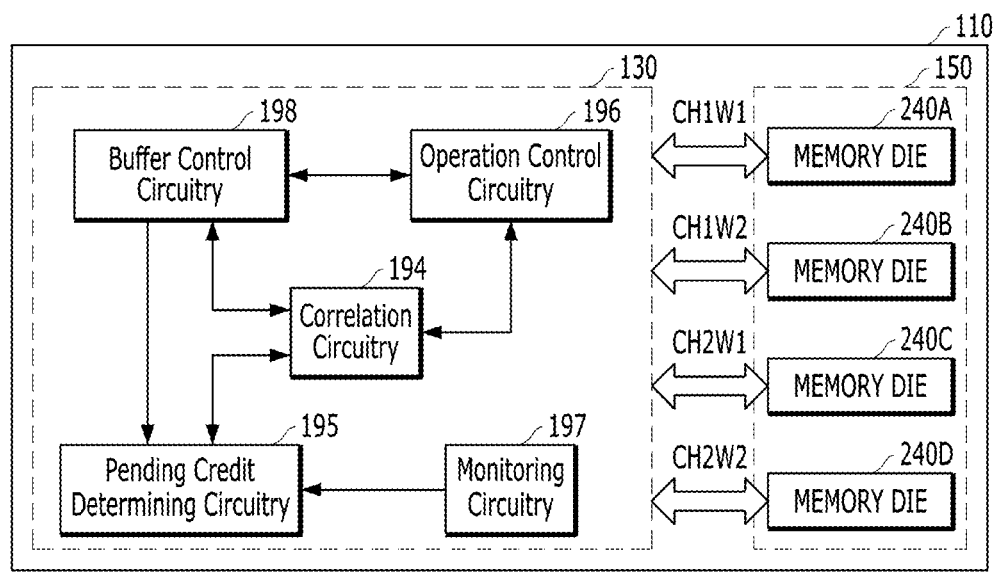
FIG. 1 is a block diagram illustrating a memory system in accordance with an embodiment of the present invention.

Various examples of the disclosure are described below in more detail with reference to the accompanying drawings. Aspects and features of the present invention, however, may be embodied in different ways to form other embodiments, including variations of any of the disclosed embodiments. Thus, the invention is not to be construed as being limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a block diagram illustrating a memory system in accordance with an embodiment of the present invention. In a computing device or a mobile device embedded with the memory system 110, a host (e.g., host 102 of FIG. 2) may be engaged with the memory system 110 for data input/output (I/O) operations. The host is a kind of external device operatively engaged with the memory system 110.

Referring to FIG. 1, the memory system 110 may include a controller 130 and a memory device 150. The controller 130 may output data, which is requested by the host 102 and delivered from the memory device 150, or store data inputted from the host 102 in the memory device 150. The memory device 150 may include a plurality of non-volatile memory cells, each capable of storing data. Here, an internal structure and/or configuration of the memory device 150 may vary depending on the applicable specification or desired performance of the memory device 150, which, in turn, may be based on the purpose(s) for which the memory system 110 is used or the requirement(s) of the host 102.

The controller 130 and the memory device 150 may be coupled through a plurality of data paths. The memory device 150 may include a plurality of memory dies 240A, 240B, 240C, 240D, which may be coupled with the controller 130 through different data paths. The first memory die 240A and the controller 130 are coupled through a first channel (CH1) and a first way (W1) CH1W1, and the second memory die 240B and the controller 130 are coupled through the first channel (CH1) and a second way (W2) CH1W2. The first memory die 240A and the second memory die 240B may share the first channel CH1, but the first memory die 240A and the second memory die 240B may use different ways W1, W2 independently. In addition, the third memory die 240C and the controller 130 are coupled through the second channel (CH2) and the first way (W1) CH2W1, and the fourth memory die 240D and the controller 130 are coupled via the second channel (CH2) and the second way (W2) CH2W2. The number of channels and/or ways constituting the data paths between the controller 130 and the memory device 150 may vary depending on the number of memory dies in the memory device 150. The number of channels and ways connecting the memory dies 240A, 240B, 240C, 240D to the controller 130 may be different, according to the purpose(s) of the memory system 110 or requirement(s) of the host 102.

The plurality of memory dies 240A, 240B, 240C, 240D in the memory device 150 may be configured as different modules and independently coupled with the controller 130 via different data paths. When multiple data paths are used for data exchange, the plurality of memory dies 240A, 240B, 240C, 240D and the controller 130 may use an interleaving scheme via plural data paths for exchanging data to increase speed of data transfer.

For the interleaving scheme to enhance the speed of data transfer between the memory device 150 and the controller 130, data to be stored is distributed over several modules rather than in a single module. In executing an interleaving scheme, a memory system may use an address limitation structure or an address scheme for distributing and storing plural pieces of new data over and in a plurality of modules of the memory device 150. For example, when programming four pieces of data, the conventional memory system stores the four pieces of data in four memory dies individually. Here, the number of pieces of data may refer to the number of data units which may be stored together by a single program operation or a single write operation can be performed. For example, when a program operation (or a write operation) with a unit of page may be performed, four pieces of data may include an amount of data programmed in four pages.

In order to increase operational efficiency of program and read operations and enhance distributed storage, a memory system may employ an address limitation structure. In the address limitation structure, when four pieces of data are programmed in four memory dies, the same physical location in each memory die is allocated. For example, when storing the four pieces of data in the four memory dies, each of the four pieces of data may be individually stored in a fifth physical location of a respective one of the four memory dies. Thereafter, when eight pieces of data are programmed, the eight pieces of data may be stored in the sixth and seventh physical locations of each memory die. Here, the physical location may indicate a block or a page in a memory die.

When storing five pieces of data in four memory dies in a memory system with the address limitation structure, two pieces of data may be stored in first and second physical locations of one memory die, and three pieces of data may be individually stored in a first physical location of the other three memory dies respectively. In the memory system with the address limitation structure, three pieces of dummy data are individually written in a second physical location of the remaining three memory dies because a piece of data inputted along with the next program request cannot be subsequently written in the second physical location of the other three memory dies.

When a memory system has an address limitation structure for an interleaving operation, operational efficiency may be degraded because pieces of dummy data may be programmed whenever a program operation with odd pieces of data, or a number of pieces of data that does not match the number of memory dies, is performed. In addition, because each memory die does not always have the same operation state (in terms of health, wear, etc.), the memory system may independently perform an additional operation to compensate for each memory die condition, which may increase overhead. In other words, an operation condition that affects one memory die may delay memory operations for associated memory dies involved in the same interleaving operation.

The memory system 110 according to an embodiment of the disclosure may adopt a full sync interleaving structure which is capable of supporting interleaving operations between the controller 130 and the memory device 150 without an address limitation structure. The full sync interleaving structure does not have an address limitation for storing data at the same location in each of a plurality of memory dies 240A, 240B, 240C, 240D in the memory device 150. The controller 130 may distribute pieces of data to be programmed according to an operation condition and an operation state of each memory die. In doing so, the pieces of data need not be evenly distributed to each memory die. For example, if one of the four memory dies 240A, 240B, 240C, 240D (say memory die 240A) cannot program a piece of data immediately due to an internal operation being performed within, the controller 130 may transfer data into three other memory dies (e.g., 240B, 240C, 240D). The controller 130 may distribute data over the plurality of memory dies 240A, 240B, 240C, 240D to increase efficiency of data transmission and reduce an operation margin of a program operation without applying a strict rule such as the address limitation structure. In addition, in a memory system 110 according to an embodiment, it is unnecessary to program dummy data, as is the case in a memory system with the address limitation structure.

After the controller 130 transfers a piece of data into the memory device 150 and the piece of data is programmed in the memory device 150, the controller 130 may generate or update map information associating a logical address with a physical location (physical address) corresponding to the data. In addition, the controller 130 may store generated or updated map information in the memory device 150.

Because the memory system 110 does not adopt the address limitation structure as described above, it might be hard to guarantee that data transmission between the controller 130 and the memory device 150 in a process of reading and outputting plural pieces of data requested by a host (or an external device) performed in an interleaving format (interleaved). Accordingly, the controller 130 may include correlation circuitry 194 for correlating a plurality of read operations requested by the host so that plural pieces of data outputted from the memory device 150 by the plurality of read operations may be interleaved.

Referring to FIG. 1, the controller 130 may include a buffer control circuitry 198, a correlation circuitry 194, an operation control circuitry 196, a pending credit determine circuitry 195, and a monitoring circuitry 197.

As used in this disclosure, the term 'circuitry' may refer to one or more of (a) hardware-only circuit implementations, such as implementations in only analog and/or digital circuitry (b) combinations of circuits and software (and/or firmware), such as: (i) a combination of processor(s) or (ii) portions of processor(s)/software including digital signal processor(s), software, and memory that work together to cause an apparatus, such as a mobile phone or server, to perform various functions and (c) to circuits, such as a microprocessor or a portion of a microprocessor, that uses software or firmware, even if the software or firmware is not physically present. As a further example, the term "circuitry" may refer to one or more processor or portion of a processor and accompanying software and/or firmware. The term "circuitry" may refer to an integrated circuit for a storage device.

The buffer control circuitry 198 may control an input buffer and an output buffer. The input buffer is configured to temporarily store a command or a piece of data which is inputted from the host. The output buffer is configured to temporarily store a piece of data corresponding to a command inputted from the host before the piece of data is transmitted to the host. For example, when the host sends read requests (or read commands) for reading plural pieces of data corresponding to 20 logical addresses to the memory system 110, the controller 130 receives the plural pieces of data corresponding to the 20 logical addresses from the memory device 150, temporarily stores the plural pieces of data in the output buffer, and outputs the plural pieces of data to the host. The buffer control circuitry 198 may recognize how many read requests are there in the input buffer to be inputted from a host or an external device. The buffer control circuitry 198 may also recognize how much data is in the output buffer to be outputted to the host or the external device.

The operation control circuitry 196 may check a physical location in the memory device 150, which corresponds to a logical address, and read a piece of data stored in the physical location. In response to a read request (or a read command) along with a logical address from an input buffer, the operation control circuitry 196 may translate the logical address into a physical address based on the map information, and request a piece of data, stored in nonvolatile memory cells indicated by the physical address, to the memory device 150. The physical address may indicate a specific physical location in the plurality of memory dies 240A, 240B, 240C, 240D in the memory device 150. When the operation control circuitry 196 handles plural read requests according to an order or a sequence of the plural read request delivered by the buffer control circuitry 198, physical addresses corresponding to the plural read requests may be randomly distributed over the plurality of memory dies 240A, 240B, 240C, 240D. For example, three consecutive physical addresses may indicate different locations in the same memory die, or four consecutive physical addresses may indicate different locations in different memory dies. In this situation, the data transmitted between the controller 130 and the plurality of memory dies 240A, 240B, 240C, 240D may be interleaved, but it is often to exchange data between the controller 130 and the plurality of memory dies 240A, 240B, 240C, 240D randomly.

When the buffer control circuitry 198 determines that there are pieces of data to be outputted to the host in the output buffer, plural read requests (or plural read commands) and plural logical addresses from the host may be transmitted to the correlation circuitry 194. The correlation circuitry 194 may check map information regarding the plural logical addresses corresponding to the plural read requests from the buffer control circuitry 198 to correlate the plural read requests, so that the operation control circuitry 196 may perform plural read operations corresponding to the plural read requests according to an interleaving scheme, e.g., plural pieces of data are interleaved between the plurality of memory dies 240A, 240B, 240C, 240D. Herein, a correlation operation performed by the correlation circuitry 194 may support parallel processing and distributed computing between the controller 130 and the plurality of memory dies 240A, 240B, 240C, 240D. When a single data path is shared by plural components, the plural components may interleave their signals or their data in the single data path. Further, when plural data paths are used by a single component, the single component may distribute plural signals or plural data over the plural data paths. The correlation operation may enable some of a plurality of read requests to be delivered into the plurality of memory dies in parallel through the plurality of channels, so that plural pieces of data corresponding to the plurality of read requests are outputted in parallel from the plurality of memory dies via the plurality of channels. The correlation operation for a plurality of read requests may include that plural pieces of data requested to the memory dies 240A, 240B, 240C, 240D may be transferred from the memory device 150 to the controller 130 according to an interleaved format.

When, for example, a host requests 20 pieces of data stored in the memory system 110, the controller 130 may receive 20 read requests for the 20 pieces of data, which are inputted from the host. The buffer control circuitry 198 may transmit the 20 read requests for the 20 pieces of data to the correlation circuitry 194. The correlation circuitry 194 tries to correlate the 20 read requests so that at least some of the 20 pieces of data are outputted according to an interleaving scheme. For example, the correlation circuitry 194 may check a physical address corresponding to a first logical address inputted along with a first read request among the 20 read requests, and recognize that first data corresponding to the first logical address is stored in the first memory die 240A. The correlation circuitry 194 may check a physical address corresponding to a second logical address inputted along with a second read request among the 20 read requests. When second data corresponding to the second read request is stored in the third memory die 240C or the fourth memory die 240D, an interleaving operation between the first and second read requests may be expected because the first data and the second data respectively corresponding to the first and second read requests may be transmitted via different channels CH1, CH2. Thus, the first and second read requests may be correlated by the correlation circuitry 194, and correlated read requests may be transmitted to the operation control circuitry 196.

However, if the second data is stored in the first memory die 240A or the second memory die 240B, the interleaving operation between the first and second read requests may not be expected because the first data and the second data respectively corresponding to the first and second read requests may be transmitted via the same channel CH1. In this case, the correlation circuitry 194 may not pair or correlate the first and second read requests. Then, the correlation circuitry 194 may check a physical address for a third read request. When third data corresponding to the third read request is stored in the third memory die 240C or the fourth memory die 240D, an interleaving operation between the first request and the third request may be expected because the first data and the third data respectively corresponding to the first and third read requests may be transmitted via different channels CH1, CH2. The correlation circuitry 194 may correlate the first read request and the third read request and transmit the correlated read request to the operation control circuitry 196. The third read request may be transmitted earlier than the second read request.

However, if the third data is stored in the first memory die 240A or the second memory die 240B, the interleaving operation between the first request and the third request may not be expected because the first and third data are transmitted via the same channel. In this case, the correlation circuitry 194 may check a physical address for a fourth read request.

As described above, the correlation circuitry 194 may check a physical location where data corresponding to a read request is stored, correlate some of read requests when an interleaving operation between the read requests may be expected, and transfer correlated read requests to the operation control circuitry 196. For the correlation operation, the correlation circuitry 194 may refer to map information in the controller 130 or loaded in a memory or a buffer of the controller 130.

The correlation operation with respect to a plurality of read requests, which is performed by the correlation circuitry 194, may adversely affect data input/output performance such as I/O throughput of the memory system 110 because the correlation operation may cause a delay. Accordingly, the correlation circuitry 194 may not perform the correlation operation for all read requests from the host. In other words, the buffer control circuitry 198 may select a second read request, which is at least a portion of a plurality of first read requests transferred from the host or the external device, and then transfer only the selected second read request to the correlation circuitry 194. For example, the buffer control circuitry 198 may detect the data to be outputted from the output buffer to the host or an external device, and then only when it is determined that correlation circuitry 194 performing a correlation operation will not influence on the data I/O throughput of the memory system 110, the buffer control circuitry 198 may transfer the read request transferred from the host or the external device to the correlation circuitry 194.

Also, the correlation circuitry 194 may not perform a correlation operation for all the second read requests transferred from the buffer control circuitry 198. The correlation circuitry 194 may perform or may not perform a correlation operation for second read requests transferred from the buffer control circuitry 198 according to a Pending Credit. For example, the correlation circuitry 194 may perform a correlation operation for the second read request transferred from the buffer control circuitry 198 when the pending credit is equal to or greater than a reference value. Conversely, the correlation circuitry 194 may not perform a correlation operation for the second read request transferred from the buffer control circuitry 198 when the pending credit is less than the reference value. Herein, the pending credit may be used as an indicator for predicting a probability, possibility, pattern, or trend of pairing when the correlation circuitry 194 performs a correlation operation with respect to the second read request transferred from the buffer control circuitry 198. Based on the pending credit, the controller 130 may be able to avoid performing an unnecessary correlation operation or performing a correlation operation that causes overhead in the memory system 110, and may therefore increase efficiency of memory operations.

A correlation operation performed by the correlation circuitry 194 may succeed or fail depending on the physical location of data corresponding to the second read request transferred from the buffer control circuitry 198. When an interleaving operation is expected from the physical location of the data corresponding to the second read request, the correlation operation performed by the correlation circuitry 194 may be regarded as a success, and read request correlated by the correlation circuitry 194 due to the successful correlation operation may be transferred to the operation control circuitry 196 in the correlated state. However, when no interleaving operation is expected from the physical location of the data corresponding to the second read request, the correlation operation performed by the correlation circuitry 194 may be regarded as a failure, and due to the failure in the correlation operation, the read request that is not correlated in the correlation circuitry 194 may be transferred to the operation control circuitry 196 in the uncorrelated state.

The pending credit determining circuitry 195 in the controller 130 may be able to determine the pending credit when the second read request is selected based on whether a correlation operation is performed before the second read request is selected, whether the correlation operation performed before the selection of the second read request is successful or not, and the operation states of a plurality of memory dies 240A, 240B, 240C, and 240D a time at which the second read request is selected. The operation states of the memory dies 240A, 240B, 240C, and 240D may be recognized by the monitoring circuitry 197 in the controller 130. When the second read request to be transferred from the buffer control circuitry 198 to the correlation circuitry 194 is selected, the pending credit determining circuitry 195 may be able to adjust the value of the pending credit based on whether a correlation operation is performed or not in the correlation circuitry 194 before the second read request is selected, and if the correlation operation is performed, whether the correlation operation performed before the selection of the second read request is successful or not, and the operation states of the memory dies 240A, 240B, 240C, and 240D when the second read request is selected.

The correlation circuitry 194 may not correlate all of the plurality of read requests from the buffer control circuitry 198. When an interleaving operation is expected considering the physical locations of the pieces of data corresponding to the plurality of read requests, the correlation circuitry 194 may perform a correlation operation. But, other read requests, received after these read requests are correlated by the correlation circuitry 194 may be transferred uncorrelated to the operation control circuitry 196.

In response to an operation environment, the controller 130 may correlate at least some of the plurality of read requests from the host, so that plural pieces of data are transferred according to an interleaving scheme between the memory device 150 and the controller 130. In addition, the memory system 110 does not have to adopt an address limitation structure for exchanging signals or data according to an interleaving scheme within the memory system 110. Plural pieces of data may be distributed and stored based on operation environment and operation states of the plurality of memory dies 240A, 240B, 240C, 240D in the memory device 150. The controller 130 may attempt to correlate read requests for reading plural pieces of data stored in the plurality of memory dies 240A, 240B, 240C, 240D in the memory device 150. Because the memory system 110 does not have to use the address limitation structure, the plurality of memory dies 240A, 240B, 240C, 240D in the memory device 150 may be operated more efficiently, and lifespans of the plurality of memory dies 240A, 240B, 240C, 240D in the memory device 150 may be improved. On the other hand, since data may be interleaved in memory dies 240A, 240B, 240C, 240D, the memory system 110 according to an embodiment of the disclosure can avoid deteriorating the data input/output performance (e.g., I/O throughput) thereof.

Figure 2:
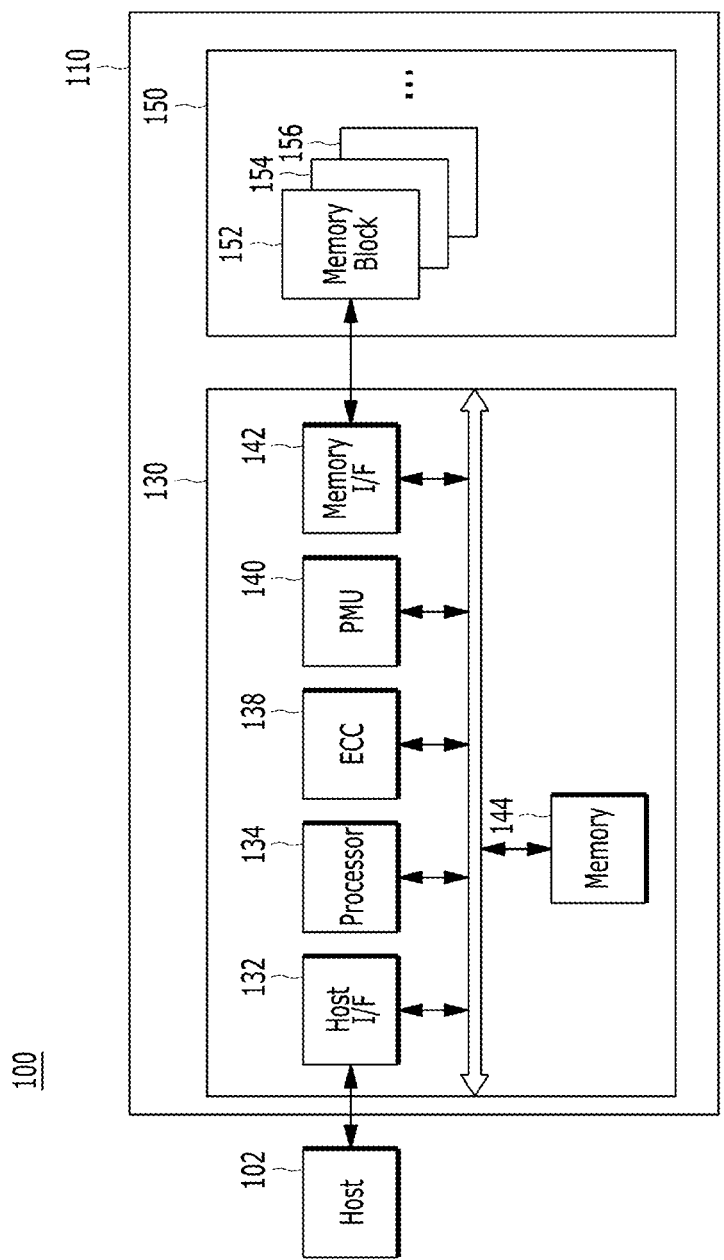
FIG. 2 is a block diagram illustrating a data processing system including a memory system in accordance with the embodiment of the present invention.

FIG. 2 is a block diagram illustrating a data processing system including a memory system in accordance with the embodiment of the present invention.

Referring to FIG. 2, the data processing system 100 may include a host 102 engaged or operably coupled with a memory system 110.

The host 102 may include any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS may provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. The enterprise operating systems may be specialized for securing and supporting high performance, including Windows servers, Linux and Unix. Further, the mobile operating system may include an Android and iOS. The mobile operating system may be subject to support services or functions for mobility (e.g., a power saving function). The host 102 may include a plurality of operating systems. The host 102 may execute multiple operating systems in cooperation with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described below with reference to FIGS. 4 and 5.

The memory system 110 may perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card and a memory stick.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as described above.

By way of example but not limitation, the controller 130 and the memory device 150 may be integrated into a single semiconductor device. The controller 130 and memory device 150 may be integrated to form an SSD with improved operation speed. When the memory system 110 is used as an SSD, the operating speed of a host 102 connected to the memory system 110 can be improved more than that of a host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, and the flash memory may have a three-dimensional stack structure.

The controller 130 may control overall operations of the memory device 150, such as read, write, program and erase operations. For example, the controller 130 may control the memory device 150 in response to a request from the host 102. The controller 130 may provide data, read from the memory device 150 to the host 102. The controller 130 may store data provided by the host 102 into the memory device 150.

The controller 130 may include a host interface (I/F) 132, a processor 134, error correction code (ECC) circuitry 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL). According to an embodiment of the present invention, the host interface 132 may include the buffer control circuitry 198 described above with reference to FIG. 1.

The ECC circuitry 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data into which a parity bit is added and store the encoded data in memory device 150. The ECC decoder may detect and correct errors contained in data read from the memory device 150 when the controller 130 reads the data stored in the memory device 150. In other words, after performing error correction decoding on the data read from the memory device 150, the ECC circuitry 138 may determine whether the error correction decoding has succeeded and output an instruction signal (e.g., a correction success signal or a correction fail signal). The ECC circuitry 138 may use the parity bit which is generated during the ECC encoding process, for correcting the error bit of the read data. When the number of error bits is greater than or equal to a threshold number of correctable error bits, the ECC circuitry 138 may not correct error bits but instead may output an error correction fail signal indicating failure in correcting the error bits.

The ECC circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuitry 138 may include any and all circuits, modules, systems or devices for performing the error correction operation based on at least one of the above described codes.

The PMU 140 may manage electrical power in the controller 130. For example, the PMU 140 may detect power-on and power-off. In addition, the PMU 140 may include a power detector.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of NAND flash interface, in particular, operations between the controller 130 and the memory device 150. In accordance with an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data used by the controller 130 and the memory device 150 to perform operations such as read operations or program/write operations.

The memory 144 may be a volatile memory. The memory 144 may be implemented with a static random access memory (SRAM), a dynamic random access memory (DRAM) or both. Although FIG. 2 shows memory 144 disposed within the controller 130, embodiments are not limited to that arrangement. That is, the memory 144 may be within or external to the controller 130. For instance, the memory 144 may be an external volatile memory having a memory interface transferring data and/or signals between the memory 144 and the controller 130.

The memory 144 may store data for performing operations such as data writing and data reading requested by the host 102 and/or data transfer between the memory device 150 and the controller 130 for background operations such as garbage collection and wear levelling. In accordance with an embodiment, for supporting operations in the memory system 110, the memory 144 may include a program memory, a data memory, a write buffer/cache, a read buffer/cache, a data buffer/cache and a map buffer/cache.

The processor 134 may be a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be a flash translation layer (FTL). The FTL may serve as an interface between the host 102 and the memory device 150. The host 102 may transmit requests for write and read operations to the memory device 150 through the FTL.

According to an embodiment, the processor 134 and the memory interface 142 may be used to perform an operation of the operation control circuitry 196, which is described above with reference to FIG. 1. According to another embodiment, the processor 134 and the memory interface 142 may be used to perform an operation of the correlation circuitry 194, which is described above with reference to FIG. 1. According to another embodiment, the processor 134 and the memory interface 142 may be used to perform an operation of the pending credit determining circuitry 195, which is described above with reference to FIG. 1. According to another embodiment, the processor 134 and the memory interface 142 may be used to perform an operation of the monitoring circuitry 197, which is described above with reference to FIG. 1.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may function as a general storage device to perform a read or write operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 may handle instructions or commands corresponding to an inputted command from the host 102. The controller 130 may perform a foreground operation as a command operation, corresponding to a command from the host 102, such as a program operation corresponding to a write command, a read operation corresponding to a read command, an erase/discard operation corresponding to an erase/discard command and a parameter set operation corresponding to a set parameter command or a set feature command with a set command.

The controller 130 may perform a background operation on the memory device 150 through the processor 134. By way of example but not limitation, the background operation for the memory device 150 includes copying data in a memory block, among the memory blocks 152, 154, 156, and storing such data in another memory block (e.g., a garbage collection (GC) operation). The background operation may include an operation to move data stored in at least one of the memory blocks 152, 154, 156 in the memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) for connecting the controller 130 to which memory die(s) in the memory 150 is/are proper or appropriate for performing each operation. The controller 130 may transmit data or instructions via the channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check a status of each channel or each way. In response to a command received from the host 102, the controller 130 may select at least one channel or way based on the status of each channel or each way so that instructions and/or operation results with data may be delivered via selected channel(s) or way(s).

The controller 130 may check the states of a plurality of channels (or ways) coupled to a plurality of memory dies that are included in the memory device 150. According to an embodiment, the controller 130 may check the states of a plurality of channels (or ways) coupled to a plurality of memory dies through the monitoring circuitry 197, which is described above with reference to FIG. 1.

By way of example but not limitation, the controller 130 may recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 may refer to descriptors delivered from the memory device 150. The descriptors may include a block or page of parameters that describe characteristics of the memory device 150, and may have a set format or structure. The descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory such as a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may substantially reduce the utilization efficiency of the memory device 150 having a 3D stack structure and the reliability of the memory system 110. Thus, reliable bad block management may enhance or improve performance of the memory system 110.

Figure 3:
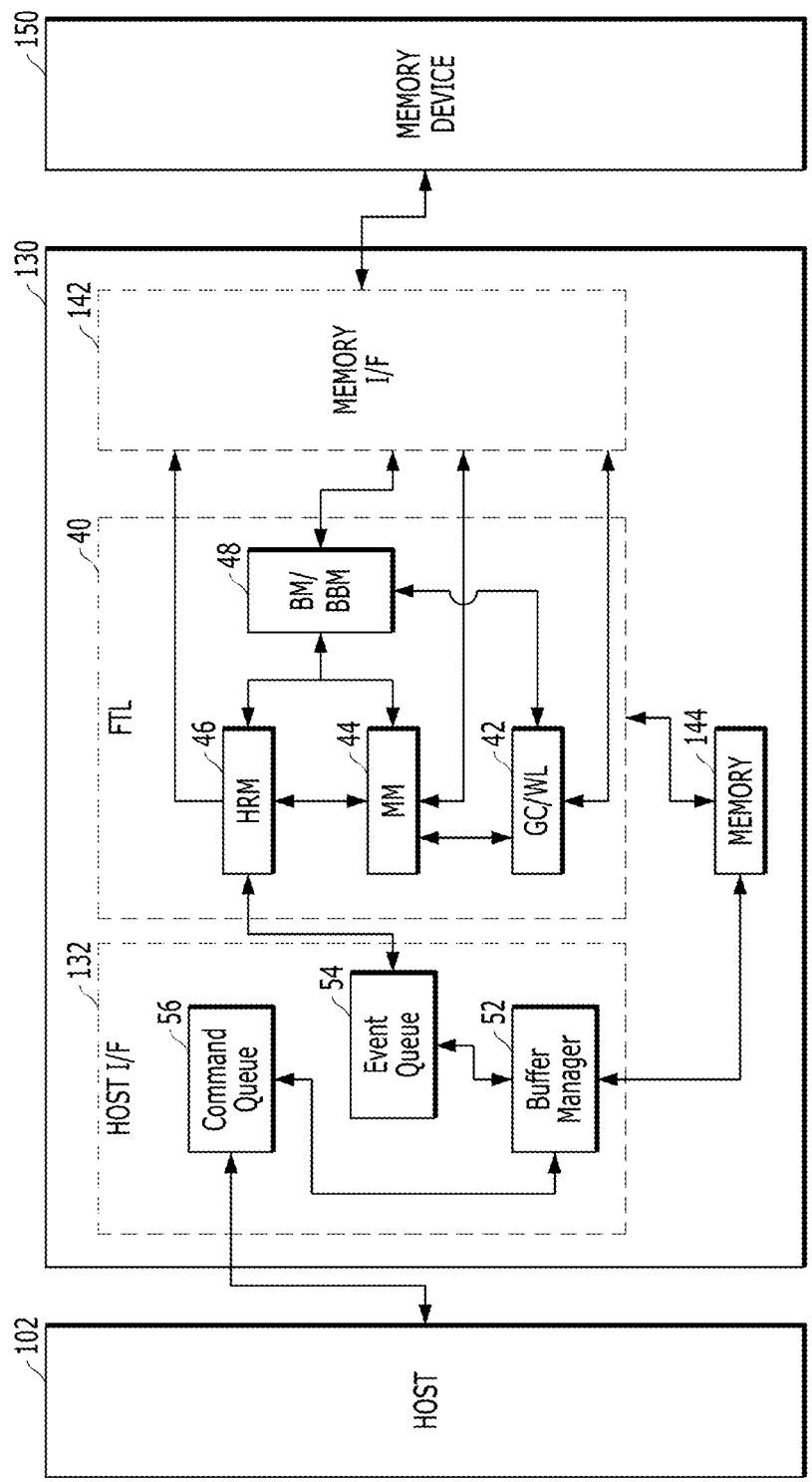
FIG. 3 is a block diagram illustrating a controller in a memory system in accordance with another embodiment of the present invention.

FIG. 3 is a block diagram illustrating a controller in a memory system in accordance with another embodiment of the present disclosure.

Referring to FIG. 3, the controller 130 cooperates with the host 102 and the memory device 150. The controller 130 may include a host interface (I/F) 132, flash translation layer (FTL) circuitry 40, a memory interface (I/F) 142 and a memory 144.

Although not shown in FIG. 3, in accordance with an embodiment, the ECC circuitry 138 in FIG. 2 may be included in the flash translation layer (FTL) circuitry 40. In another embodiment, the ECC circuitry 138 may be implemented as a separate module, a circuit, or firmware, which is included in, or associated with, the controller 130.

Also, according to an embodiment, the flash translation layer (FTL) circuitry 40 and the memory interface 142 may serve as the correlation circuitry 194, which is described above with reference to FIG. 1. According to another embodiment, the flash translation layer (FTL) circuitry 40 and the memory interface 142 may serve as the pending credit determining circuitry 195, which is described above with reference to FIG. 1. According to another embodiment, the flash translation layer (FTL) circuitry 40 and the memory interface 142 may serve as the monitoring circuitry 197, which is described above with reference to FIG. 1.

The host interface 132 may handle commands and data from the host 102. By way of example but not limitation, the host interface 132 may include a command queue 56, a buffer manager 52 and an event queue 54. The command queue 56 may sequentially store commands and data from the host 102 and output them to the buffer manager 52 in a stored order. The buffer manager 52 may classify, manage or adjust commands and data which are delivered from the command queue 56. The event queue 54 may sequentially transmit events for processing the commands and the data, from the buffer manager 52.

A plurality of commands or data having the same characteristics may be continuously received from the host 102, or commands and data having different characteristics may be transmitted to the memory system 110 after being mixed. For example, a plurality of read commands may be delivered, or read commands and program/write commands may be alternately transmitted to the memory system 110. The host interface 132 may sequentially store commands and data, which are received from the host 102, to the command queue 56. Thereafter, the host interface 132 may estimate or predict what kind of internal operation the controller 130 will perform according to the characteristics of the command and data which is received from the host 102. The host interface 132 may determine a processing order and a priority of commands and data, based at least on their characteristics. According to characteristics of commands and data, from the host 102, the buffer manager 52 in the host interface 132 is configured to determine whether the buffer manager 52 should store commands and data in the memory 144, or whether the buffer manager 52 should deliver the commands and the data into the flash translation layer (FTL) circuitry 40. The event queue 54 receives events, entered from the buffer manager 52, which are to be internally executed and processed by the memory system 110 or the controller 130 in response to the commands and the data from the host 102, so as to deliver the events into the flash translation layer (FTL) circuitry 40 in the order received.

In accordance with an embodiment, the host interface 132 in FIG. 3 may perform the functions of the controller 130 in FIG. 2.

In accordance with an embodiment, the flash translation layer (FTL) circuitry 40 may include a state manager (GC/WL) 42, a map manager (MM) 44, a host request manager (HRM) 46, and a block manager (BM/BBM) 48. The host request manager 46 may manage the events entered from the event queue 54. The map manager 44 may handle or control map data. The state manager 42 may perform garbage collection (GC) or wear leveling (WL). The block manager 48 may execute commands or instructions onto a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44, to determine a physical address corresponding to the logical address which is entered with the events. The host request manager 46 may send a read request with the physical address to the memory interface 142, to process the read request (handle the events). On the other hand, the host request manager 46 may send a program request (or write request) to the block manager 48, to program entered data to an empty page (i.e., a page having no data) in the memory device 150, and then, may transmit a map update request corresponding to the program request to the map manager 44, to update mapping addresses.

The block manager 48 may convert a program request delivered from the host request manager 46, the map data manager 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance or maximize parallel processing of the multi-channel and multi-directional flash controller.

The block manager 48 may be configured to manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move the valid data to an empty block and erase remaining data in the blocks from which the valid data was moved so that the block manager 48 may have enough free blocks. If the block manager 48 provides information regarding a block to be erased to the state manager 42, the state manager 42 is able to check all flash pages of the block to be erased to determine whether each page is valid. To determine validity of each page, the state manager 42 may identify a logical address stored in an out-of-band (OOB) area of each page. To determine whether each page is valid, the state manager 42 may compare the physical address of the page with the physical address mapped to the logical address obtained from the request. The state manager 42 sends a program request to the block manager 48 for each valid page. A mapping table may be updated through the update of the map manager 44 when the program operation is complete.

The map manager 44 may manage a logical-physical mapping table. The map manager 44 may process requests such as queries and updates, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and issue an update request. When the state manager 42 requests the map update in a state in which copying of valid page(s) has not been completed, the map manager 44 may not perform the mapping table update. This is because the map request is issued with old physical information if the state manger 42 requests a map update and a valid page copy is not completed until later. The map manager 44 may perform a map update operation to ensure accuracy only if the latest map table still points to an old physical address.

The memory device 150 may include a plurality of memory blocks. Each of the plurality of memory blocks may be a single level cell (SLC) memory block or a multi level cell (MLC) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block and a combination thereof. The double level memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5 or more bits of data.

In an embodiment of the disclosure, the memory device 150 is a nonvolatile memory such as a flash memory such as a NAND flash memory, a NOR flash memory and the like. In another embodiment, the memory device 150 may be at least one of a phase change random access memory (PCRAM), a ferroelectric random access memory (FRAM) and a spin injection magnetic memory (e.g., a spin transfer torque magnetic random access memory (STT-M RAM)).

Figure 4:
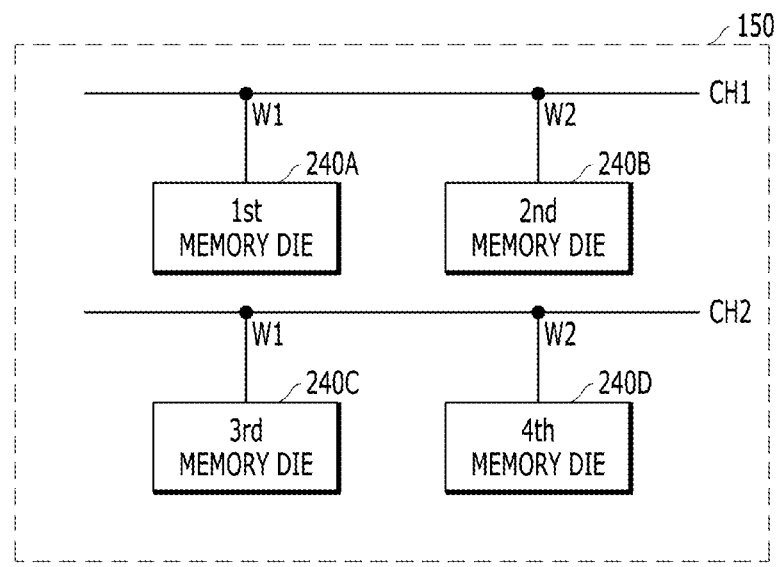
FIG. 4 is a block diagram illustrating an internal structure of a memory device.

FIG. 4 is a block diagram illustrating an internal structure of a memory device. More specifically, FIG. 4 illustrates an internal configuration of the memory device 150.

Referring to FIG. 4, the memory device 150 may include the plurality of memory dies 240A, 240B, 240C, 240D. The first memory die 240A and the second memory die 240B may be connected to the controller 130 (see FIGS. 1 through 3) through the first channel CH #1. The third memory die 240C and the fourth memory die 240D may be connected to the controller 130 through the second channel CH #2.

FIG. 4 shows a configuration in which four memory dies 240A, 240B, 240C, 240D are coupled to the controller 130 through two channels CH #1, CH #2. However, embodiments are not limited that or any particular configuration of dies and channels. Even though the memory device 150 may include at least two dies and at least two channels, the number of dies and channels in a given configuration depends on various factors, such as the overall configuration of the memory system, the purpose(s) for which it is employed and the specification defining communication between the memory system and the engaged host.

When a plurality of memory dies is connected to a single channel, each memory die may be coupled with the channel through different ways. In FIG. 4, the first memory die 240A and the second memory die 240B may be coupled with the first channel CH #1 through the first way W1 and the second way W2, respectively. The third memory die 240C and the fourth memory die 240D may be coupled with the second channel CH #2 through the first way W1 and the second way W2, respectively. In this particular configuration, the number of ways is the same as the number of memory dies.

Figure 5A:
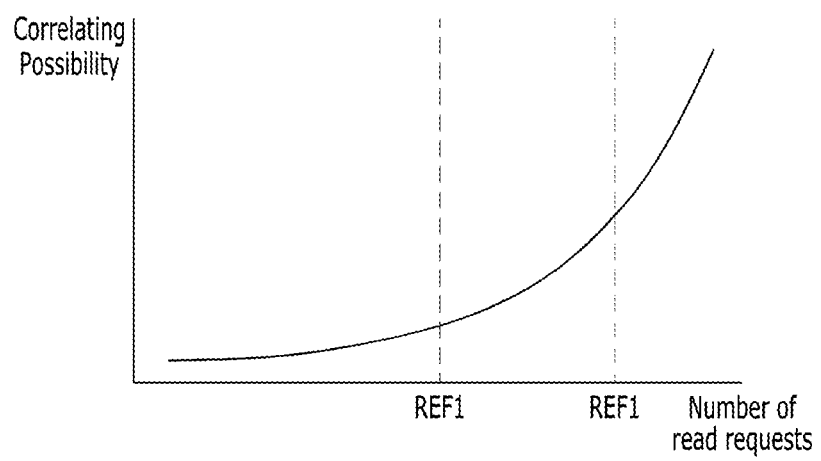
FIGS. 5A and 5B illustrate characteristics of a correlation operation performed by a controller.
Figure 5B:
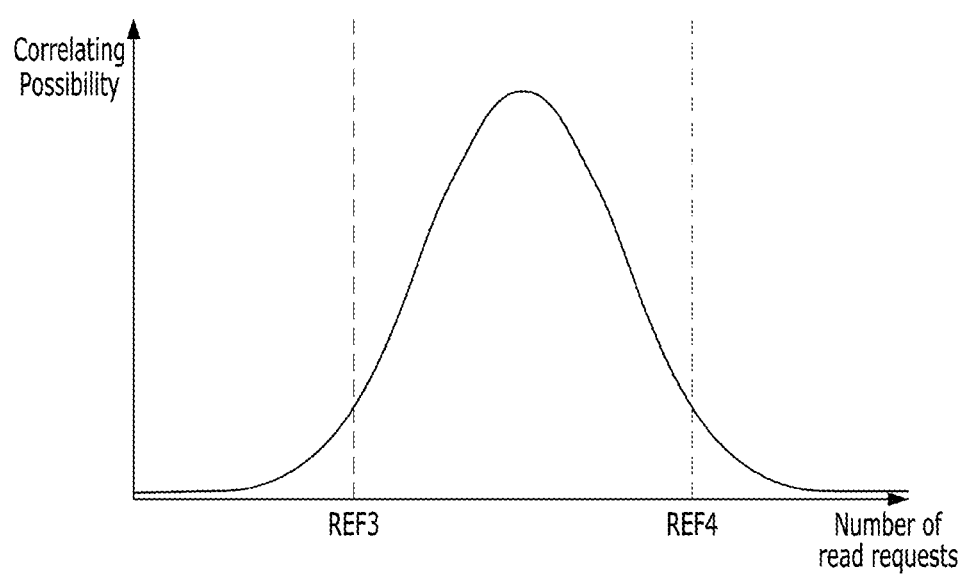

FIGS. 5A and 5B illustrate characteristics of a correlation operation performed by the controller. Specifically, the two graphs in FIGS. 5A and 5B may illustrate a result obtained by performing correlation operations repeatedly under an unspecified and random conditions.

Referring to FIG. 5A, as the correlation circuitry 194 in the controller 130 of FIG. 1 attempts to establish correlations for an increasing number of read requests, a probability of correlating such read requests increases as the number of read requests increase. For example, the probability of finding a correlation within 20 read requests is greater than that of 5 read requests.

When there is no address limitation in a memory system, physical locations in the memory device 150 corresponding to logical addresses delivered with a few read requests may not be distributed. In this case, the number of read requests correlated by the correlation circuitry 194 may be small. However, when a large number of read requests are transmitted to the memory system 110, the probability that the read requests are correlated is higher. For example, the probability of correlation may be higher when the number of read requests is the second reference value REF2 compared to when the number of read requests is the first reference value REF1, which is less than REF2.

Referring to FIG. 5B, when a plurality of read requests are sequentially transmitted to the correlation circuitry 194, the probability of correlation according to an input time (or input sequence) of the read requests is described. As described with reference to FIG. 4, it is assumed that there are two channels between the controller 130 and the memory device 150 in the memory system 110. For example, a first read request sent to the correlation circuitry 194 may not be correlated because there are no other read requests which are ready to be correlated. When a second read request is delivered to the correlation circuitry 194, the second read request may or may not be correlated with the first read request; the probability is 50:50. When a third read request is delivered to the correlation circuitry 194, the correlation circuitry 194 may attempt to correlate the third read request with the first and second read requests if the first and second read requests are not correlated. Thus, the probability of correlation may be higher at the time when the third read request is delivered than at the time when the second read request is delivered. Based on these characteristics, the correlation circuitry 194 may distinguish states before and after a specific read request is received. For example, after a read request (corresponding to third reference value REF3) is received, the correlation circuitry 194 may determine that a probability of correlation is sufficiently high, and attempt to perform the correlation operation on the previously-received read request(s) together with the (REF3) read request. In contrast, before the (REF3) read request is received, the correlation circuitry 194 may determine that a probability of correlation is too low, and thus skip performing the correlation operation on the read requests received before the REF3 read request.

In another example, it is assumed that 20 read requests are delivered. When the 19th and 20th read requests are inputted, the probability of correlation may be lower when the 9th to 11th read requests are inputted. This is because, when the 19th and 20th read requests are inputted, the previously inputted 1st to 18th read requests read requests may have been already correlated and outputted to the operation control circuitry 196. As the correlated read requests are transferred over time, the probability of correlation may be lowered. In order to avoid the correlation circuitry 194 wasting resources such as time, operation margin, or power to perform the correlation operation, the correlation operation may be stopped at a time when the read request corresponding to a fourth reference value REF4 is transmitted.

In an embodiment, the correlation circuitry 194 may stop the correlation operation in response to the number of uncorrelated read requests. For example, if a small number of uncorrelated read requests, e.g., two or three, remain, among the 20 read requests, the correlation circuitry 194 may output the uncorrelated read requests to the operation control circuitry 196 without holding them for a next correlation operation. When the correlation circuitry 194 holds a few read requests for performing a next correlation operation, the data input/output performance (e.g., I/O throughput) of the memory system 110 may be deteriorated.

As shown in FIG. 5B, when the correlation circuitry 194 determines whether to perform a correlation operation or not by using only the number of read requests transferred from the buffer control circuitry 198 as a reference REF3 or REF4, the accuracy or efficiency of the operation of determining whether to perform the correlation operation or not may be deteriorated. For example, when the success of correlation operations occur more frequently than an estimated probability, all of the estimated number of read requests may be processed in a shorter time than the estimated time, and the correlation circuitry 194 may go to an idle state. Conversely, when the correlation operation fails more frequently than the estimated probability, all of the estimated number of read requests may not be processed within the estimated time, and data input/output (I/O) throughput may be adversely affected. Also, when the success of the correlation operation is repeated only for particular memory dies among the memory dies 240A, 240B, 240C, and 240D, the remaining memory dies that do not become the target for the correlation operation (or the other memory dies in which the correlation operation fails) due to a policy of preferentially processing a read request for which the correlation operation is successful may remain in the idle state (even though there are corresponding read requests).

In order to prevent this problem from occurring, when the second read request to be transferred from the buffer control circuitry 198 to the correlation circuitry 194 is selected, the pending credit determining circuitry 195 may check out whether a correlation operation is performed or not in the correlation circuitry 194 before the second read request is selected and if the correlation operation is performed, check from the correlation circuitry 194 whether the correlation operation is performed successfully or not, check from the monitoring circuitry 197 the operation states of the memory dies 240A, 240B, 240C, and 240D at a time when the second read request is selected, combine the checked results, and convert the combination result into a value called the pending credit. Subsequently, the correlation circuitry 194 may determine whether to perform a correlation operation or not for the second read request which is selected and inputted when the second read request is selected based on the pending credit which is determined when the second read request is selected.

Figure 6:
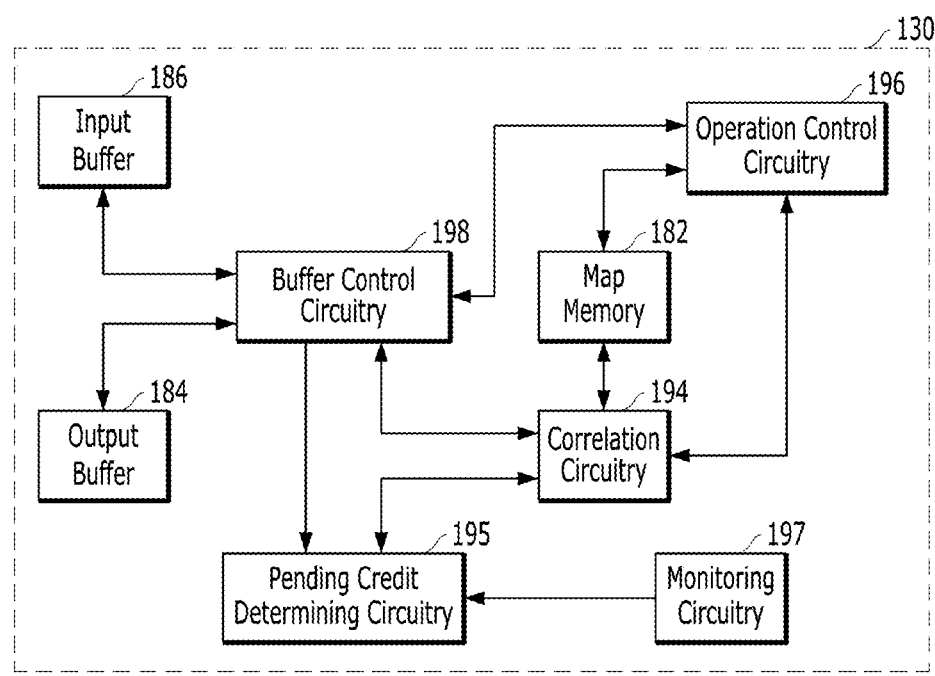
FIG. 6 is a block diagram illustrating an internal structure of the controller.

FIG. 6 is a block diagram illustrating an internal structure of the controller 130.

Referring to FIG. 6, the controller 130 may include an input buffer 186, an output buffer 184, buffer control circuitry 198, correlation circuitry 194, pending credit determining circuitry 195, monitoring circuitry 197, a memory map 182, and operation control circuitry 196. The buffer control circuitry 198, the correlation circuitry 194, and the operation control circuitry 196 may determine whether to perform or stop a correlation operation by interlocking with the output buffer 186, the input buffer 184, the pending credit determining circuitry 195, the monitoring circuitry 197, and the map memory 182.

According to an embodiment, the output buffer 186, the input buffer 184, and the map memory 182 may be functional separations, and they may be realized inside the memory 144 which is described above with reference to FIGS. 2 to 3. According to another embodiment n, the output buffer 186, the input buffer 184, and the map memory 182 may be a plurality of non-volatile memory devices or a plurality of cache memories.

The output buffer 186 and the input buffer 184 may have a data architecture such as a queue. In this case, the output buffer 186 and the input buffer 184 may output data in the order that the data are stored (FIFO). The map memory 182 may have various structures according to a policy for storing and managing map data and map information.

The controller 130 may translate a logical address, which is an address transferred from an external device or the host 102 into a physical address indicating a physical location in the memory device 150. The controller 130 may load map data and map information stored in the memory device 150 for the address translation.

According to an embodiment, when there is sufficient storage space in the memory 144 included in the controller 130 or interworking with the controller 130, all map data and map information used for address translation may be read at once. However, when memory system 110 is mounted in a portable terminal, the controller 130 not have sufficient storage space for storing both map data and map information. In this case, the controller 130 may utilize the space of the memory 144 for storing map data and map information by reading out specific map information from the memory device 150, using or updating the specific map information, storing it in the memory device 150, and then reading out another map information stored in the memory device 150.

When the requested map data cannot be stored in a region in the memory 144, the controller 130 may remove the least recently used map data from the region. The controller 130 requesting the memory device 150 for the map data and the map information for the address translation may serve as overhead on the overall performance or the I/O throughput of the memory system 110. Therefore, embodiments may prevent the controller 130 from requesting unnecessary map data and map information.

For example, when there are 20 read requests for correlation operation, The map memory 182 may be checked based on the logical addresses associated with the 20 read requests, the map data for 11 read requests may be in the map memory 182, and the map data and map addresses for 9 read requests may not be present in the map memory 182. In this case, the controller 130 may load the map data and the map addresses for the 9 read requests into the map memory 182. According to an embodiment, when the storage space of the map memory 182 is not sufficient, the correlation circuitry 194 in the controller 130 may preferentially perform a correlation operation for a read request for which a map address is detectable.

A correlation operation performed by the correlation circuitry 194 may be recognized as overhead in terms of the input/output (I/O) throughput of the memory system 110.

Accordingly, the correlation circuitry 194 may determine whether to perform a correlation operation for the second read request, which is selected when the second read request is selected and inputted from the buffer control circuitry 198, based on the pending credit that is determined by the buffer control circuitry 198 when the second read request is selected. For example, when the pending credit determined when the second read request is selected in the buffer control circuitry 198 is equal to or greater than a reference value, the correlation circuitry 194 may perform a correlation operation for the second read request which is selected when the second read request is selected and inputted from the buffer control circuitry 198. Conversely, when the pending credit determined when the second read request is selected in the buffer control circuitry 198 is less than the reference value, the correlation circuitry 194 may not perform a correlation operation.

Herein, the pending credit determining circuitry 195 may determine the pending credit by checking whether a correlation operation is performed or not in the correlation circuitry 194 before the second read request to be transferred from the buffer control circuitry 198 to the correlation circuitry 194 is selected.

The pending credit determine circuitry 195 may increase the pending credit in response to processing second read request without performing a correlation operation in the correlation circuitry 194 before the second read request is selected in the buffer control circuitry 198. More specifically, the pending credit determine circuitry 195 may adjust the increment amount of the pending credit according to the expected processing time of the second read request that is processed by the correlation circuitry 194 without performing a correlation operation before the second read request is selected in the buffer control circuitry 198. When the expected processing time of the second read request processed by the correlation circuitry 194 without performing a correlation operation is approximately 50 us, the pending credit determine circuitry 195 may increase the pending credit by 5 and determine it as a new pending credit. Also, when the expected processing time of the second read request processed by the correlation circuitry 194 without performing a correlation operation is approximately 10 us, the pending credit determining circuitry 195 may increase the pending credit by 1 and determine it as a new pending credit. Herein, when the correlation circuitry 194 processes the second read request without performing a correlation operation, the pending credit determined by the pending credit determining circuitry 195 may be less than the reference value when the second read request is selected in the buffer control circuitry 198. Also, the expected processing time of two different read requests may vary depending on the situation, because the size of the data that are read from the memory device 150 may vary depending on the read request. Herein, since the size of the data that are read from the memory device 150 may be known in advance in response to the read request, the expected processing time corresponding to the read request may also be determined in advance. Of course, the expected processing time corresponding to the read request may also vary according to the type or performance of the memory device 150.

The pending credit determining circuitry 195 may be able to determine the pending credit by performing a correlation operation before the second read request to be transferred from the buffer control circuitry 198 to the correlation circuitry 194 is selected and then checking the correlation circuitry 194 to determine whether the correlation operation is performed successfully or not.

To be specific, the pending credit determining circuitry 195 may increase the pending credit in response to a success of the correlation operation performed by the correlation circuitry 194 before the time at which the second read request is selected in the buffer control circuitry 198, and may decrease the pending credit in response to a failure of the correlation operation. More specifically, the pending credit determining circuitry 195 may adjust the amount by which a pending credit is incremented according to the amount of time that is expected to be shortened due to the success of the correlation operation performed by the correlation circuitry 194 before the time at which when the second read request is selected in the buffer control circuitry 198. Also, the pending credit determining circuitry 195 may adjust the amount by which the pending credit is decremented according to an amount of time that is consumed due to the failure of the correlation operation performed by the correlation circuitry 194 before a time at which when the second read request is selected in the buffer control circuitry 198.

For example, when the amount of time expected to be shortened due to the success of the correlation operation performed by the correlation circuitry 194 is approximately 30 us, the pending credit determining circuitry 195 may increase the pending credit by 3 and determine it as a new pending credit. When the amount of time consumed due to the failure of the correlation operation performed by the correlation circuitry 194 is approximately 20 us, the pending credit determining circuitry 195 may decrease the pending credit by 2 and determine it as a new pending credit. In an embodiment, the time may be shortened due to the success of the correlation operation because, when the correlation operation is successful, two or more read requests may be processed at once by an interleaving scheme and this requires less time than individually processing the two or more read requests without performing a correlation operation. In other words, the difference between the amount of time expected to be consumed for individually processing the two or more read requests without performing a correlation operation and the amount of time expected to be consumed for collectively processing the two or more read requests all at once by the interleaving scheme through the success of the correlation operation may be the time that is shortened due to the success of the correlation operation. Also, the reason that time is consumed due to a failure of the correlation operation is that, when the correlation operation fails, time is used to confirm the failure by performing a correlation operation, but eventually, the read request is processed the same as if the correlation operation is not performed. In short, the time taken to perform the correlation operation which is determined as a failure may be the time consumed due to the failure of the correlation operation.

The pending credit determining circuitry 195 may determine the pending credit by checking the monitoring circuitry 197 to determine the operation states of a plurality of memory dies 240A, 240B, 240C, and 240D at a time when the second read request to be transferred from the buffer control circuitry 198 to the correlation circuitry 194 is selected.

The pending credit determining circuitry 195 may decrease the pending credit in response to at least one memory die of the memory dies 240A, 240B, 240C and 240D being in an idle state when the second read request is selected in the buffer control circuitry 198. More specifically, the pending credit determining circuitry 195 may adjust the decrement amount of the pending credit according to the number of idle-state memory dies among the memory dies when the second read request is selected in the buffer control circuitry 198. For example, when there is only one memory die in an idle state among the memory dies when the second read request is selected, the pending credit determine circuitry 195 may decrease the pending credit by 2 and determine it as a new pending credit. Also, when there are two memory dies in the idle state among the memory dies at the moment when the second read request is selected, the pending credit determining circuitry 195 may decrease the pending credit by 4 and determine it as a new pending credit.

The pending credit determining circuitry 195 may determine whether to perform a correlation operation or not according to the pending credit in the correlation circuitry 194 when the second read request is selected in the buffer control circuitry 198, and when no other second read request is selected by the buffer control circuitry 198 for a predetermined reference time, the pending credit determine circuitry 195 may reset the pending credit to an initial value. In other words, when the correlation operation performed by the correlation circuitry 194 is not continuously performed for a predetermined reference time, the pending credit determine circuitry 195 may reset the pending credit to the initial value. The initial value of the pending credit may be less than a reference value of the pending credit that is used as a reference when the correlation circuitry 194 determines whether to perform a correlation operation or not. The reference time may be set long enough to determine that two read requests having a difference as much as the reference time are not consecutive with each other. For example, the reference time may be a time required for a read request to be transferred to a plurality of memory dies after a correlation operation for the read request is successfully performed and to be completely processed.

Figure 7:
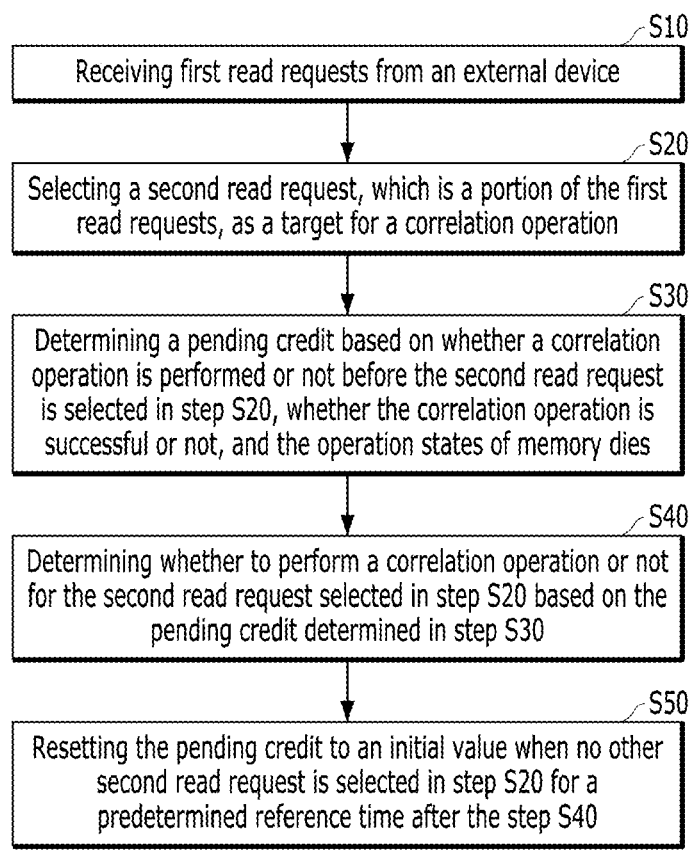
FIGS. 7 and 8 are flowcharts describing a first example of a method for operating a memory system.
Figure 8:
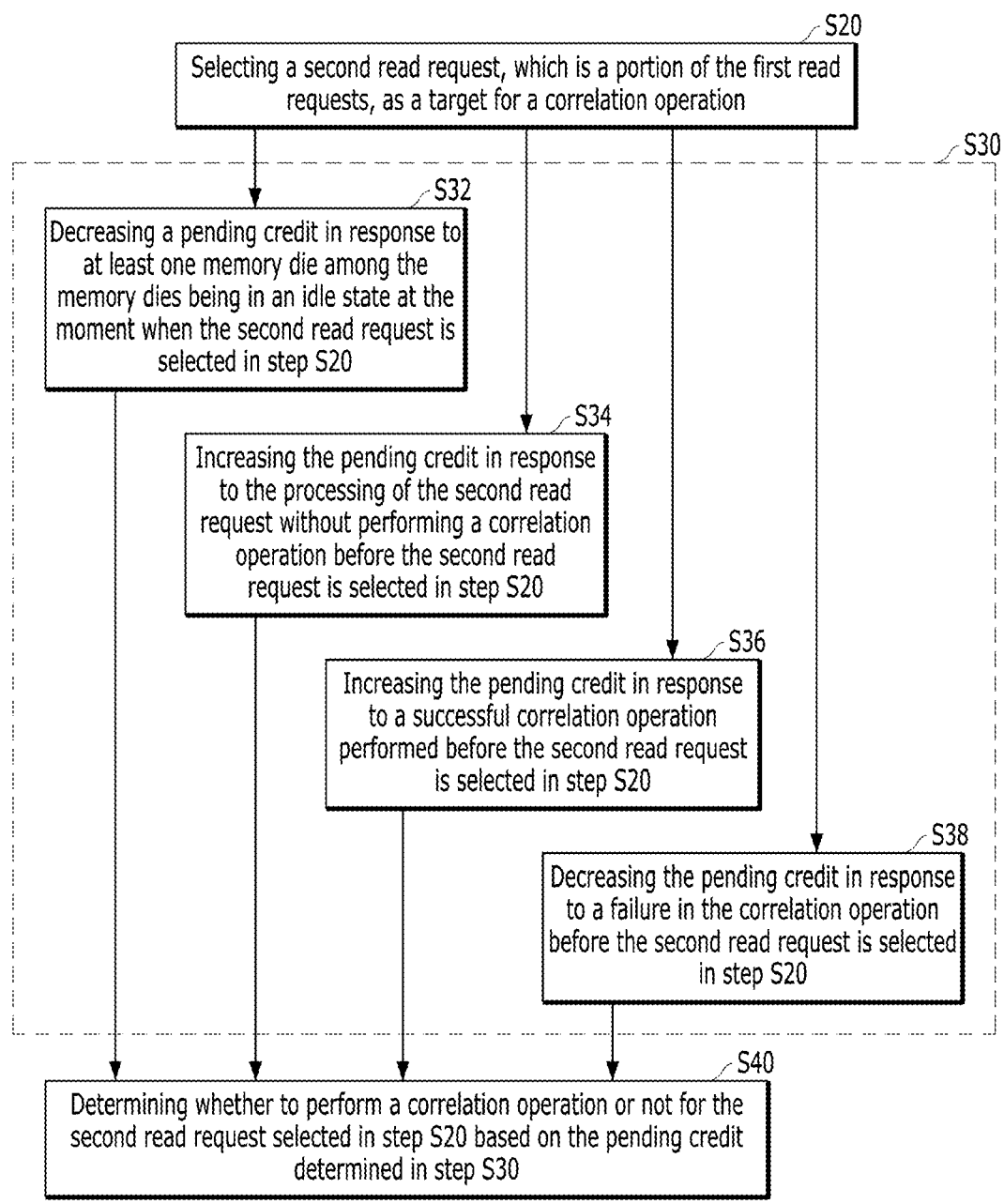

FIGS. 7 and 8 are flowcharts describing a first example of a method for operating a memory system.

First, referring to FIG. 7, a method for operating a memory system may include: a reception step S10 of receiving a plurality of first read requests transferred from an external device; a selection step S20 of selecting a second read request which is at least a portion of the first read requests as a target for a correlation operation; a determination step S30 of determining a pending credit based on whether a correlation operation is performed or not before the second read request is selected, whether the correlation operation is performed successfully or not, and the operation states of a plurality of memory dies; a step S40 of determining whether to perform a correlation operation or not for the second read request that is selected in the selection step S20 based on the pending credit that is determined in the determination step S30; and a reset step S50 of resetting the pending credit to an initial value when no other second read request is selected in the selection step S20 for a predetermined reference time after whether to perform the correlation operation or not is determined in the step S40.

The method for operating a memory system may further include: a first transfer step of, when a correlation operation is performed in the step S40 for the second read request that is selected in the selection step S20, performing an address translation for the read requests that are correlated due to a successful correlation operation and transferring the translated address of the correlated read requests to a plurality of memory dies through a plurality of channels; a first reception step of receiving data for the read requests that are correlated by an interleaving scheme through a plurality of channels after the first transfer step; a second transfer step of performing an address translation for the read requests that are not correlated due to a failure in the correlation operation and transferring the translated address of the uncorrelated read requests to the memory dies; a second reception step of receiving data corresponding to the uncorrelated read requests from the memory dies after the second transfer step; and an output step of outputting the data received in the first reception step and the second reception step to an external device. Herein, the correlated read requests of the first transfer step may be transferred to the memory dies prior to the uncorrelated read requests of the second transfer step, thereby improving the input/output throughput of the memory system 110.

In the selection step S20 may be based on the number of the first read requests transferred from the external device, the operation state of the output buffer and the like. In order to perform the correlation operation without deteriorating the input/output throughput of the memory system, second read requests may be selected as the correlation operation targets after the operation margin for the correlation operation is secured.

For example, it may be determined whether the number of data remaining in the output buffer to be outputted to an external device for the selection step S20 is greater than a predetermined reference number or not. In this case, the reference number may be determined based on a first data input/output rate between the external device and the memory system and a second data input/output rate between the controller and the memory dies. For example, it may be assumed that it takes approximately 10 ms for the memory system to transfer data to the external device. When the output buffer includes 10 data to be outputted to the external device, the memory system may have an operation margin of approximately 100 ms (=10×10). If it takes approximately 5 ms to transfer read requests and receive data between the controller and the memory device in the memory system, the controller may attempt a correlation operation with a maximum operation margin of approximately 95 ms out of the 100 ms operating margin.

The controller in the memory system may have information about the operation rate and the required time according to an internal operation and may be able to calculate the operation margin according to a protocol with the host working with the memory system. Therefore, the controller may calculate and estimate an operation margin for which the controller is capable of attempting a correlation operation. For example, the controller may calculate the maximum value of an operation margin for a correlation operation and then perform a correlation operation for a time corresponding to approximately 70 to 90% of the maximum value. According to an embodiment, the time range during which the controller may be able to attempt to perform a correlation operation may vary. Also, the controller may be able to determine an operation margin that the controller may attempt a correlation operation based on the operation environment of the memory system, the operation state of the memory device, and the like.

In the determination step S30, the pending credit may be determined when the second read request is selected in the selection step S20. To be specific, referring to FIG. 8, the determination step S30 may include: a first decrease step S32 of decreasing a pending credit in response to at least one memory die being in an idle state when the second read request is selected in the selection step S20; a first increase step S34 of increasing the pending credit in response to processing second read request without performing a correlation operation before the second read request is selected in the selection step S20; a second increase step S36 of increasing the pending credit in response to a successful correlation operation performed before the second read request is selected in the selection step S20; and a second decrease step S38 of decreasing the pending credit in response to a failure of the correlation operation before the second read request is selected in the selection step S20. The first decrease step S32, the first increase step S34, the second increase step S36, and the second decrease step S38 included in the determination step S30 may operate in parallel with each other. For example, when at least one memory die is in an idle state when the second read request is selected in the selection step S20 and a correlation operation is performed successfully before the moment when the second read request is selected, the first decrease step S32 and the second increase step S36 may be performed in parallel to determine the pending credit.

Herein, in the first decrease step S32, the decrement amount of the pending credit may be adjusted according to the number of idle-state memory dies when the second read request is selected in the selection step S20. In other words, the amount by which the pending credit that is decreased when the number of the idle-state memory dies is 2 may be greater than the amount by which the pending credit that is decreased when the number of the idle-state memory dies is 1.

In the first increase step S34, the increment amount of the pending credit may be adjusted according to an expected processing time of the second read request which is processed without performing a correlation operation before the second read request is selected in the selection step S20. In other words, the amount by which the pending credit is increased when the expected processing time of the second read request is processed without performing a correlation operation before the second read request is selected in the selection step S20 may be greater than the amount by which the pending credit is increased when the expected processing time of the second read request processed without performing a correlation operation before the second read request is selected in the selection step S20 is relatively small.

In the second increase step S36, the increment amount of the pending credit may be adjusted according to the time that is expected to be shortened due to a successful correlation operation that is performed before the second read request is selected in the selection step S20. In other words, the amount by which the pending credit is increased when the time that is expected to be shortened due to a successful correlation operation that is performed before the second read request is selected in the selection step S20 is relatively long may be greater than the amount by which the pending credit is increased when the time that is expected to be shortened due to a successful correlation operation that is performed before the second read request is selected in the selection step S20 is relatively short.

In the second decrease step S38, the decrement amount of the pending credit may be adjusted according to the time that is consumed due to a failure in the correlation operation that is performed before the second read request is selected in the selection step S20. In other words, the amount by which the pending credit is decreased when the time that is consumed due to a failure in the correlation operation which is performed before the second read request is selected in the selection step S20 is relatively long may be greater than the amount by which the pending credit is decreased when the time that is consumed due to a failure in the correlation operation which is performed before the second read request is selected in the selection step S20 is relatively short.

In step S40, whether to perform a correlation operation for the second read request selected in the selection step S20 may be determined according to the pending credit determined in step S30. To be specific, when the pending credit determined in step S30 is equal to or greater than a reference value at the moment when the second read request is selected in the selection step S20, a correlation operation for the second read request selected in the selection step S20 may be performed in the step S40. On the contrary, when the pending credit determined in step S30 is less than the reference value at the moment when the second read request is selected in the selection step S20, a correlation operation for the second read request selected in the selection step S20 may not be performed in step S40.

In the reset step S50, when no other second read request is selected in the selection step S20 for a predetermined reference time or more after determination step S30, the pending credit may be reset to an initial value. The initial value of the pending credit may be smaller than the reference value of the pending credit which is a criterion for determining whether to perform the correlation operation or not in step S30. In other words, after the pending credit is reset to the initial value through the reset step S50, the second read request selected for the first time through the selection step S20 may not be correlated in the step S40, because the pending credit begins at an initial value.

Figure 9A:
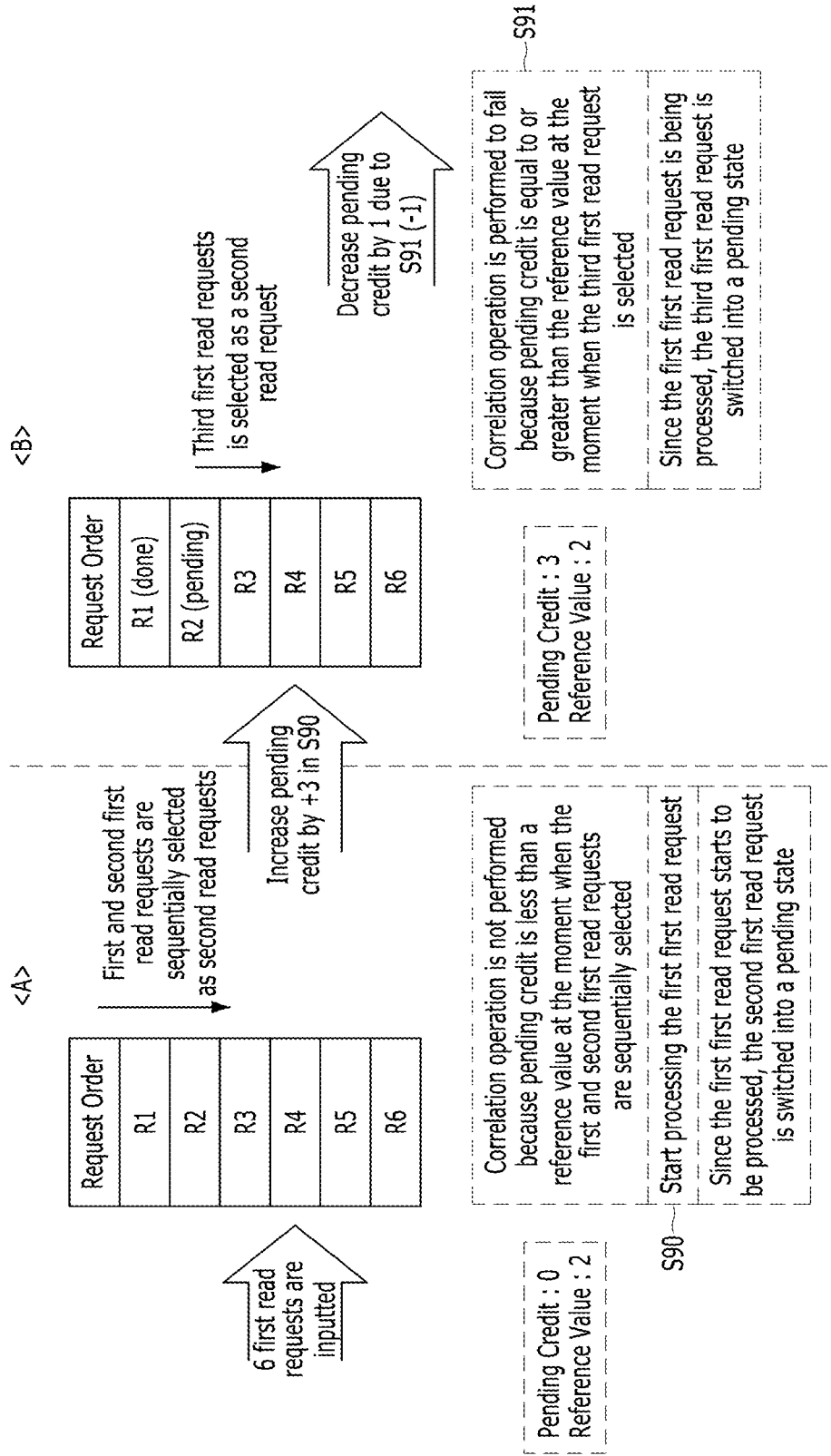
FIGS. 9A to 9C illustrate a first operation of a controller for a plurality of read requests.
Figure 9B:
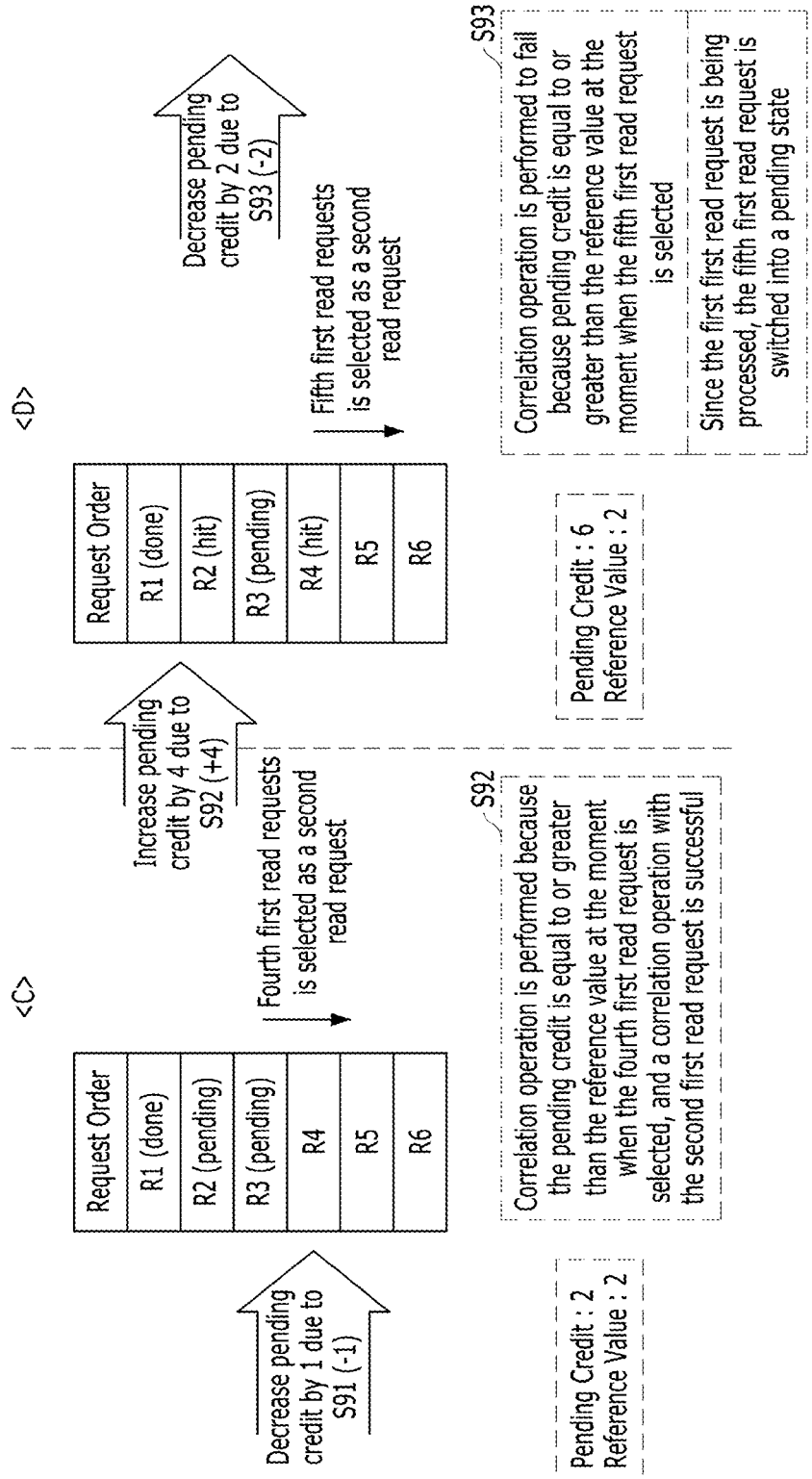
Figure 9C:
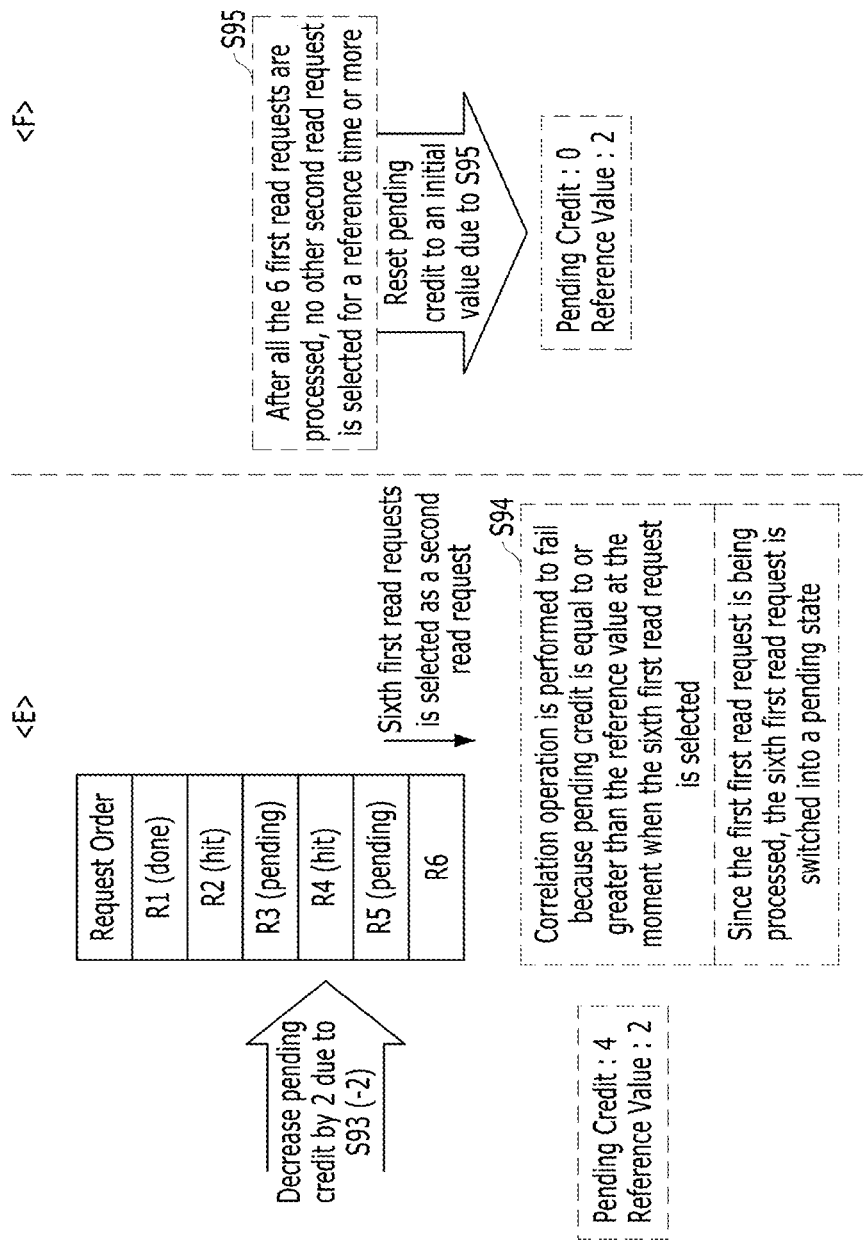

FIGS. 9A to 9C illustrate a first operation of the controller 130 for a plurality of read requests. The first operation may be performed by the pending credit determining circuitry 195 and the correlation circuitry 194, which are described earlier with reference to FIG. 6.

In the embodiments of FIGS. 9A to 9C, a plurality of first read requests are inputted from an external device or the host 102 and stored in the input buffer 186. The first read requests stored in the input buffer 184 may be arranged according to the order in which they are transferred and inputted from the external device or the host. The first read requests include six read requests R1 to R6.

The read requests R1 to R6 transferred from the external device or the host 102 may have the same structure according to an agreed protocol. However, for the sake of convenience in description, the order of 1 to 6 is shown in the read requests R1 to R6 in FIGS. 9A to 9C. Each of the read requests R1 to R6 may be transferred together with a logical address (not shown) used by the external device or the host 102.

Referring to the map memory 182, the correlation circuitry 194 in the controller 130 may check which memory die the read request is supposed to be transferred by using the logical address transferred together with the transferred first read requests R1 to R6.

Referring to <A> of FIG. 9A, the first and second first read requests among the six first read requests R1 to R6 stored in the input buffer 186 are selected as the second read requests R1 and R2, and the pending credit is initialized at 0.

Since only one second read request R1 exists when the first read request R1 is selected as a second read request, it may not be a target for a correlation operation. Therefore, whether to perform a correlation operation or not may not be determined when only the first second read request R1 is selected.

Subsequently, since there are two second read requests R1 and R2 when first read request R2 is selected, the second first read request R2 may be a target for a correlation operation. However, since the pending credit is 0, the pending credit is smaller than the reference value, which is 2, so a correlation operation may not be performed.

Subsequently, the first second read request R1 is transferred to and processed in one memory die among the memory dies in step S90. In other words, the first second read request R1 is processed in the step S90 without performing a correlation operation. In this case, since the first second read request is being processed, the second read request R2 may be in a pending state.

As described above, in response to the first second read request R1 being processed in the step S90 without a correlation operation, the pending credit determining circuitry 195 may increase the pending credit by 3. The pending credit determining circuitry 195 may increase the pending credit when the third first read request R3 is selected as a second read request. In other words, at a time when the third first read request R3 is selected as the second read request in <B> of FIG. 9A, the pending credit determining circuitry 195 may increase the pending credit by checking whether the first second read request R1 is processed in the step S90 without a correlation operation in <A> of FIG. 9A. For the sake of convenience in description, FIG. 9A shows the pending credit increases as it goes from <A> to <B>.

Referring to <B> of FIG. 9A, it may be seen that a first read request R3 among the six first read requests stored in the input buffer 186 is selected as the second read request. Also, it may be seen that the pending credit is 3.

Since the second read request R2 is in a pending state and the pending credit is also equal to or greater than a reference value, a correlation operation may be performed when the first read request R3 is selected as the second read request. In other words, a correlation operation may be performed for the third second read request R3.

Accordingly, the correlation circuitry 194 may determine whether the memory die corresponding to second read request R3 and the memory die corresponding to second read request R2 may be correlated. It may be assumed herein that as a result of the correlation operation, the memory die corresponding to the second read request R3 and the memory die corresponding to the second read request R2 cannot be correlated, that is, the correlation operation fails in step S91. In this case, since the first second read request R1 is being processed, the second and third second read requests R2 and R3 may be in the pending state.

As described above, in response to a failure in the correlation operation for the second read request R3, the pending credit determining circuitry 195 may decrease the pending credit by 1. The pending credit in the pending credit determining circuitry 195 may be decreased when a the first read request R4 is selected as a second read request. In other words, at the moment when the fourth first read request R4 is selected as the second read request in <C> of FIG. 9B, the pending credit determining circuitry 195 may decrease the pending credit by checking whether the correlation operation for the third second read request R3 fails (in the step S91) in <B> of FIG. 9A. The pending credit decrease is shown from <B> of FIG. 9A to <C> of FIG. 9B.

Referring to <C> of FIG. 9B, a first read request R4 ais selected as the second read request, and the pending credit is 2.

When read request R4 is selected as the second read request, a correlation operation may be performed because read requests R2 and R3 are in the pending state and the pending credit is equal to or greater than the reference value. In short, a correlation operation may be performed for the fourth second read request R4.

Accordingly, the correlation circuitry 194 may check whether a memory die corresponding to the fourth second read request R4 may be correlated up with a memory die corresponding to the second read request R2 or a memory die corresponding to the second read request R3. As a result of the correlation operation, the memory die corresponding to the second read request R4 and the memory die corresponding to the second read request R2 may be correlated with each other. In short, it may be assumed that the correlation operation is performed successfully in step S92.

As described above, in response to the successful correlation operation for the second read request R4, the pending credit determining circuitry 195 may increase the pending credit by 4 when the first read request R5 is selected as a second read request. In other words, when fifth first read request R5 is selected as the second read request in <D> of FIG. 9B, the pending credit determine circuitry 195 may increase the pending credit by confirming that the correlation operation for the fourth second read request R4 is performed successfully in step S92 in <C> of FIG. 9B. the figures show the pending credit increase from <C> of FIG. 9B to <D> of FIG. 9B.

Referring to <D> of FIG. 9B, the fifth first read request R5 among the six first read requests stored in the input buffer 186 is selected as the second read request, and the pending credit is 6.

At the moment when read request R5 is selected as the second read request, since the second read request R3 is in a pending state and the pending credit is equal to or greater than the reference value, the correlation operation may be performed. In other words, the correlation operation for the second read request R5 may be performed. Since the second read request R3 and the fourth second read request R4 are already correlated, they cannot be selected as read information for the correlation operation of the first read request R5.

Accordingly, the correlation circuitry 194 may determine whether the memory die corresponding to read request R5 and the memory die corresponding to read request R3 are correlated. As a result of the correlation operation, the memory die corresponding to the second read request R5 and the memory die corresponding to the second read request R3 cannot be correlated, that is, the correlation operation fails in step S93. In this case, since the first second read request R1 is in being processed, the third and fifth second read requests R3 and R5 may be in the pending state.

As described above, in response to a failure in the correlation operation for the fifth second read request R5, the pending credit determining circuitry 195 may decrease the pending credit by 2. Herein, the time for decreasing the pending credit in the pending credit determining circuitry 195 may be a time when the sixth first read request R6 is selected as a second read request. In other words, when the sixth first read request R6 is selected as the second read request in <E> of FIG. 9C, the pending credit determine circuitry 195 may decrease the pending credit by checking whether the correlation operation for the fifth second read request R5 fails (in step S93) in <D> of FIG. 9B. The pending credit decreases is shown from <D> of FIG. 9B to <E> of FIG. 9C.

The pending credit is decreased by the pending credit determining circuitry 195 in response to the failure of the correlation operation for the second read request R3 in <B> of FIG. 9A is 1, and the pending credit decreased by the pending credit determine circuitry 195 in response to the failure in the correlation operation for the second read request R5 in <D> of FIG. 9B is 2. The decrement amounts of the two cases are different despite the fact that the pending credits are decreased by the pending credit determining circuitry 195 in response to the failure in the correlation operation in both cases. This is because the time consumed due to the failure in the correlation operation for the third second read request R3 is assumed to be shorter than the time consumed due to the failure in the correlation operation for the fifth second read request R5.

Referring to <E> of FIG. 9C, it may be seen that the first read request R6 is selected as a second read request, and the pending credit is 4.

When read request R6 is selected as the second read request, the correlation operation may be performed because the second read requests R3 and R5 are in the pending state and the pending credit is equal to or higher than the reference value. In short, the correlation operation for the sixth second read request R6 may be performed.

Accordingly, the correlation circuitry 194 may determine whether the memory die corresponding to the second read request R6 may be correlated up with the memory die corresponding to the second read request R3 or the memory die corresponding to the second read request R5. As a result of the correlation operation, the memory die corresponding to the second read request R6 may not be correlated up with the memory die corresponding to the second read request R3 or the memory die corresponding to the second read request R5, that is, the correlation operation fails in step S94.

As described above, the pending credit determining circuitry 195 may decrease the pending credit in response to the failure of the correlation operation for the second read request R6. The pending credit determining circuitry 195 may decrease the pending credit when the sixth first read request R6 is selected as the second read request and then another first read request is selected as a second read request within a predetermined reference time.

However, referring to <F> of FIG. 9C, it is assumed in step S95 that no other first read request is selected as a second read request for a predetermined reference time or more after the first read request R6 is selected as the second read request. In other words, it is assumed that after all of the six first read requests R1 to R6 stored in the input buffer 186 are selected and processed as the second read requests, no other first read requests are inputted any longer for a predetermined reference time, or even when another first read request is inputted, the inputted first read request is not selected as a second read request due to the operation state of the memory system 110.

Therefore, no operation of decreasing the pending credit in the pending credit determine circuitry 195 in response to a failure in the correlation operation for the sixth second read request R6 may be performed.

Also, the pending credit may be reset to an initial value of 0 when read request R6 is selected as a second read request and no other second read request is selected for a predetermined reference time or longer in step S95.

According to an embodiment of the disclosure, a memory system, a data processing system, a method of operating the same, and a method of supporting an operation may avoid an address limitation regarding a physical location in the memory system, which is allocated for storing data, for an interleaving operation. Thus, the memory system may reduce overhead in the memory system for an interleaving operation.

In addition, an embodiment of the disclosure may improve data input/output performance through an interleaving operation in a memory system, and reduce the address limitation regarding an physical location in the memory system for the interleaving operation, so that operational efficiency and lifespan of the memory device may be improved.

The effects of embodiments are not limited to the effects described by the present disclosure.

While embodiments been illustrated and described with respect to specific examples, it will be apparent to those skilled in the art in light of the present disclosure that various changes and modifications may be made without departing from the scope of following claims.

What is claimed is:

1. A memory system, comprising:
a plurality of memory dies; and
a controller that is coupled to the memory dies through a plurality of channels, the controller comprising circuitry that:
selects a second read request, including at least a portion of a plurality of first read requests transferred from an external device, so that the memory dies interleave and output data corresponding to the first read requests through the channels, and
performs a correlation operation for the selected second read request,
wherein, when the second read request is selected, the controller determines whether the correlation operation is performed or not before a time at which the second read request is selected, determines whether the correlation operation is successful or not, determines a pending credit in response to an operation state of the memory dies at the time at which the second read request is selected, and determines whether to perform the correlation operation or not for the second read request that is selected at the time at which the second read request is selected based on the pending credit.

2. The memory system of claim 1, wherein when the pending credit is less than a reference value, the controller processes the selected second read request without performing the correlation operation, and
when the pending credit is equal to or greater than the reference value, the controller performs the correlation operation for the selected second read request.

3. The memory system of claim 2, wherein the controller decreases the pending credit when at least one of the memory dies is in an idle state at the time at which the second read request is selected.

4. The memory system of claim 3, wherein the amount by which the pending credit is decreased is based on the number of memory dies that are in an idle state when the second read request is selected.

5. The memory system of claim 2, wherein the controller increases the pending credit when the second read request is processed without performing the correlation operation before the time at which the second read request is selected.

6. The memory system of claim 5, wherein the amount by which the pending credit is decreased is based on an expected processing time of the second read request that is processed without performing the correlation operation before the time at which the second read request is selected.

7. The memory system of claim 2, wherein the controller increases the pending credit in response to the correlation operation being successful before the time at which the second read request is selected and decreases the pending credit in response to a failure of the correlation operation before the time at which the second read request is selected.

8. The memory system of claim 7, wherein the controller adjusts an amount by which the pending credit is increased based on how much time is expected to be saved due to the success of the correlation operation that is performed before the time at which second read request is selected.

9. The memory system of claim 8, wherein the controller adjusts an amount by which the pending credit is decreased based on an amount of time consumed due to the failure of the correlation operation that is performed before the time at which the second read request is selected.

10. The memory system of claim 2, wherein when the second read request is not selected for more than a reference time after determining whether to perform the correlation operation or not based on the pending credit, and
the controller resets the pending credit to an initial value that is smaller than the reference value.

11. The memory system of claim 2, wherein the controller includes:
an input buffer configured to temporarily store the first read request;
an output buffer configured to temporarily store data to be outputted to the external device;
buffer control circuitry configured to monitor states of the input buffer and the output buffer and select the second read request;
monitoring circuitry configured to monitor operation states of the memory dies;
correlation circuitry configured to determine whether to perform the correlation operation for the second read request based on the pending credit, and output correlated read requests prior to uncorrelated read requests;
pending credit determining circuitry configured to determine the pending credit in response to operations of the buffer control circuitry, the monitoring circuitry, and the correlation circuitry; and operation performing circuitry configured to perform address translation for a read request transferred from the correlation circuitry and transfer a resultant address to the memory dies through the channels.

12. A method for operating a memory system including a plurality of memory dies for storing data, comprising:
   receiving a plurality of first read requests transferred from an external device;
   selecting a second read request including at least a portion of a plurality of first read requests to cause the memory dies to interleave and output data corresponding to the first read requests through the channels;
   when the second read request is selected, determining a pending credit in response to whether a correlation operation is performed or not before the second read request is selected, determining whether the correlation operation is successful or not, and determining operation states of the memory dies when the second read request is selected; and
   determining whether to perform the correlation operation or not for the second read request based on the pending credit.

13. The method of claim 12, wherein determining whether to perform the correlation operation includes:
   when the pending credit is less than a reference value, processing the second read request without performing the correlation operation; and
   when the pending is equal to or greater than the reference value, performing the correlation operation for the second read request.

14. The method of claim 13, wherein determining the pending credit includes:
   decreasing the pending credit in response to at least one of the memory dies being in an idle state when the second read request is selected;
   increasing the pending credit when the second read request is processed without performing the correlation operation before the second read request is selected;
   increasing a value of the pending credit in response to the correlation operation being successful before the second read request is selected; and
   decreasing the value of the pending credit in response to a failure of the correlation operation before the second read request is selected.

15. The method of claim 14, further comprising:
   adjusting an amount by which the pending credit is decreased based on a number of memory dies that are in an idle state when the second read request is selected.

16. The method of claim 14, further comprising:
   adjusting an amount by which the pending credit is increased based on an expected processing time of the second read request that is processed without performing the correlation operation before the second read request is selected.

17. The method of claim 14, further comprising:
   adjusting an amount by which the pending credit is increased based on a time expected to be shortened due to a successful correlation operation performed before the second read request is selected.

18. The method of claim 14, further comprising:
   adjusting an amount by which the pending credit is decreased based on a time consumed due to a failed correlation operation that is performed before the second read request is selected.

19. The method of claim 12, further comprising:
   resetting the pending credit to an initial value, wherein the initial value is smaller than the reference value, when the second read request is not selected for more than a reference time.

20. The method of claim 12, further comprising:
   when the correlation operation for the second read request that is selected in selecting the second read request is performed in determining whether to perform the correlation operation for the second read request,
   translating an address for read requests that are correlated due to a successful correlation operation and transferring a resultant address to the memory dies through the channels;
   receiving data for the correlated read requests in an interleaving scheme through the channels after translating the address for the correlated read requests;
   translating an address for uncorrelated read requests that are not correlated due to a failed correlation operation and transferring a resultant address to the memory dies;
   receiving data corresponding to the uncorrelated read requests from the memory dies after translating the address translation for the uncorrelated read requests; and
   outputting the received data to the external device.

* * * * *